(12) United States Patent
Nagashima

(10) Patent No.: US 9,850,055 B2
(45) Date of Patent: Dec. 26, 2017

(54) PACKAGING STRUCTURE FOR PACKING SUBSTRATE STORING CONTAINER

(71) Applicant: MIRAIAL CO., LTD., Tokyo (JP)

(72) Inventor: Tsuyoshi Nagashima, Tokyo (JP)

(73) Assignee: Miraial Co., Ltd., Tokyo (JP)

( * ) Notice: Subject to any disclaimer, the term of this patent is extended or adjusted under 35 U.S.C. 154(b) by 99 days.

(21) Appl. No.: 15/021,542

(22) PCT Filed: Sep. 13, 2013

(86) PCT No.: PCT/JP2013/074887
§ 371 (c)(1),
(2) Date: Jun. 10, 2016

(87) PCT Pub. No.: WO2015/037136
PCT Pub. Date: Mar. 19, 2015

(65) Prior Publication Data
US 2016/0280443 A1    Sep. 29, 2016

(51) Int. Cl.
*B65D 5/58*     (2006.01)
*B65D 81/05*    (2006.01)
*B65D 81/113*   (2006.01)
*H01L 21/673*   (2006.01)

(52) U.S. Cl.
CPC .......... *B65D 81/051* (2013.01); *B65D 81/113* (2013.01); *H01L 21/6732* (2013.01); *H01L 21/67369* (2013.01); *H01L 21/67376* (2013.01)

(58) Field of Classification Search
USPC ................ 206/521, 585, 591, 592, 593, 594
See application file for complete search history.

(56) References Cited

U.S. PATENT DOCUMENTS

| | | | | |
|---|---|---|---|---|
| 2,951,669 A | * | 9/1960 | Davidson | B65D 5/5035 108/51.3 |
| 3,356,209 A | * | 12/1967 | Pezely, Jr. | B65D 81/107 206/523 |
| 5,462,171 A | * | 10/1995 | Moog | B65D 81/113 206/588 |

(Continued)

FOREIGN PATENT DOCUMENTS

| | | |
|---|---|---|
| JP | 58-159268 U | 10/1983 |
| JP | 59-3873 U | 1/1984 |

(Continued)

*Primary Examiner* — Jacob K Ackun
(74) *Attorney, Agent, or Firm* — Muncy, Geissler, Olds & Lowe, P.C.

(57) ABSTRACT

The first cushioning portion includes: a cushioning support portion that directly abuts the substrate storing container to support the substrate storing container; and a cushioning-portion connecting portion that is connected to the cushioning support portion, and extends downwards from the cushioning support portion. The second cushioning portion includes: a cushioning plate-like portion in which a through-hole is formed; and cushioning leg portions which are configured by a cushioning material which is softer than the cushioning-portion connecting portion of the first cushioning portion, and extend downwards from the cushioning plate-like portion. The cushioning plate-like portion supports the first cushioning portion in a state in which the cushioning-portion connecting portion penetrates through the through-hole of the cushioning plate-like portion.

7 Claims, 19 Drawing Sheets

(56) References Cited

U.S. PATENT DOCUMENTS

| | | | |
|---|---|---|---|
| 6,405,873 B2 * | 6/2002 | Koike | B65D 81/025 206/320 |
| 6,817,161 B1 * | 11/2004 | Wu | B65D 81/113 206/308.1 |
| 2009/0166248 A1 | 7/2009 | Onda et al. | |

FOREIGN PATENT DOCUMENTS

| | | |
|---|---|---|
| JP | 62-31062 U | 2/1987 |
| JP | 63-97672 U | 6/1988 |
| JP | 63-197830 U | 12/1988 |
| JP | 7-291280 A | 11/1995 |
| JP | 2000-159270 A | 6/2000 |
| JP | 2007-137454 A | 6/2007 |
| JP | 2010-132331 A | 6/2010 |

\* cited by examiner

PACKAGING STRUCTURE FOR PACKING SUBSTRATE STORING CONTAINER

TECHNICAL FIELD

The present invention relates to a packing structure for packing a substrate storing container that stores substrates such as semiconductor wafers.

BACKGROUND ART

As a container that stores substrates such as semiconductor wafers, a substrate storing container has been known conventionally that has a container main body and a lid body. When such a substrate storing container is packed in a packing box for transportation, a resin cushioning material and the like is arranged in the packing box. The cushioning material retains the substrate storing container in the packing box and reduces the transfer of impact or vibration to the substrate storing container from outside of the packing box. In such use, there are cases where a cushioning material composed of at least two different materials is used (refer to Japanese Unexamined Patent Application, Publication No. H07-291280).

Patent Document 1: Japanese Unexamined Patent Application, Publication No. H07-291280

DISCLOSURE OF THE INVENTION

Problems to be Solved by the Invention

For example, in a case of a cushioning material composed of two different materials being used, it is easy to adhesively fix a part of the cushioning material composed of one material with a part of the cushioning material composed of the other material. However, in such a case, outgas is generated depending on an adhesive used. Then, there is danger of the outgas thus generated clinging to a packing bag of a substrate storing container, and being carried together therewith upon bringing the substrate storing container into a clean room.

It is an object of the present invention to provide a packing structure for packing a substrate storing container that, upon using a cushioning material composed of two different materials as a cushioning material disposed in a packing box of a substrate storing container when transporting the substrate storing container, can fix the cushioning materials without using an adhesive.

Means for Solving the Problems

The present invention relates to a packing structure for packing a substrate storing container for storing and transporting substrates composed of semiconductor wafers, comprising: a packing box; and a lower cushioning material on which the substrate storing container is placed in the packing box, in which the lower cushioning material includes a first cushioning portion and a second cushioning portion, in which the first cushioning portion includes: a cushioning support portion that is configured by a cushioning material, and directly abuts the substrate storing container to support the substrate storing container; and a cushioning-portion connecting portion that is configured by a cushioning material, is connected to the cushioning support portion, and extends downwards from the cushioning support portion, in which the second cushioning portion includes: a cushioning plate-like portion in which a through-hole is formed; and cushioning leg portions which are configured by a cushioning material which is softer than the cushioning-portion connecting portion of the first cushioning portion, and extend downwards from the cushioning plate-like portion, and in which the cushioning plate-like portion supports the first cushioning portion in a state in which the cushioning-portion connecting portion penetrates through the through-hole of the cushioning plate-like portion.

Furthermore, it is preferable that a lower end portion of the cushioning leg portion of the second cushioning portion is supported by the packing box, and a lower end portion of the cushioning-portion connecting portion of the first cushioning portion is not supported by the packing box, and is located more upwards than the lower end portion of the cushioning leg portion and spaced apart from the packing box.

Furthermore, it is preferable that the cushioning support portion and the cushioning-portion connecting portion of the first cushioning portion are integrally formed from identical cushioning material.

Furthermore, it is preferable that a cushioning material that constitutes the cushioning leg portion of the second cushioning portion is configured by any of a coil spring, an air spring, gel, sponge, rubber, and polymeric foam having elasticity.

Furthermore, it is preferable that the cushioning plate-like portion of the second cushioning portion is configured by a rigid body that has a plate-like shape including a flat upper face and a flat lower face and can abut the cushioning support portion of the first cushioning portion, and has rigidity which can suppress deformation of the cushioning support portion and support the cushioning support portion when the substrate storing container is placed on the cushioning support portion of the first cushioning portion.

Furthermore, it is preferable that a cushioning material that constitutes the cushioning leg portion of the second cushioning portion is configured with a sponge, the cushioning plate-like portion of the second cushioning portion is configured by a sponge which is the same as the sponge constituting the cushioning leg portion, and the cushioning plate-like portion and the cushioning leg portion are integrally formed.

Furthermore, it is preferable that the cushioning-portion connecting portion of the first cushioning portion is not adhered to the cushioning plate-like portion of the second cushioning portion, and is fixed to the cushioning plate-like portion by fitting into the through-hole of the cushioning plate-like portion.

Effects of the Invention

According to the present invention, it is possible to provide a packing structure for packing a substrate storing container that, upon using a cushioning material composed of two different materials as a cushioning material disposed in a packing box of a substrate storing container when transporting the substrate storing container, can fix the cushioning materials without using an adhesive.

PREFERRED MODE FOR CARRYING OUT THE INVENTION

Figure 1:
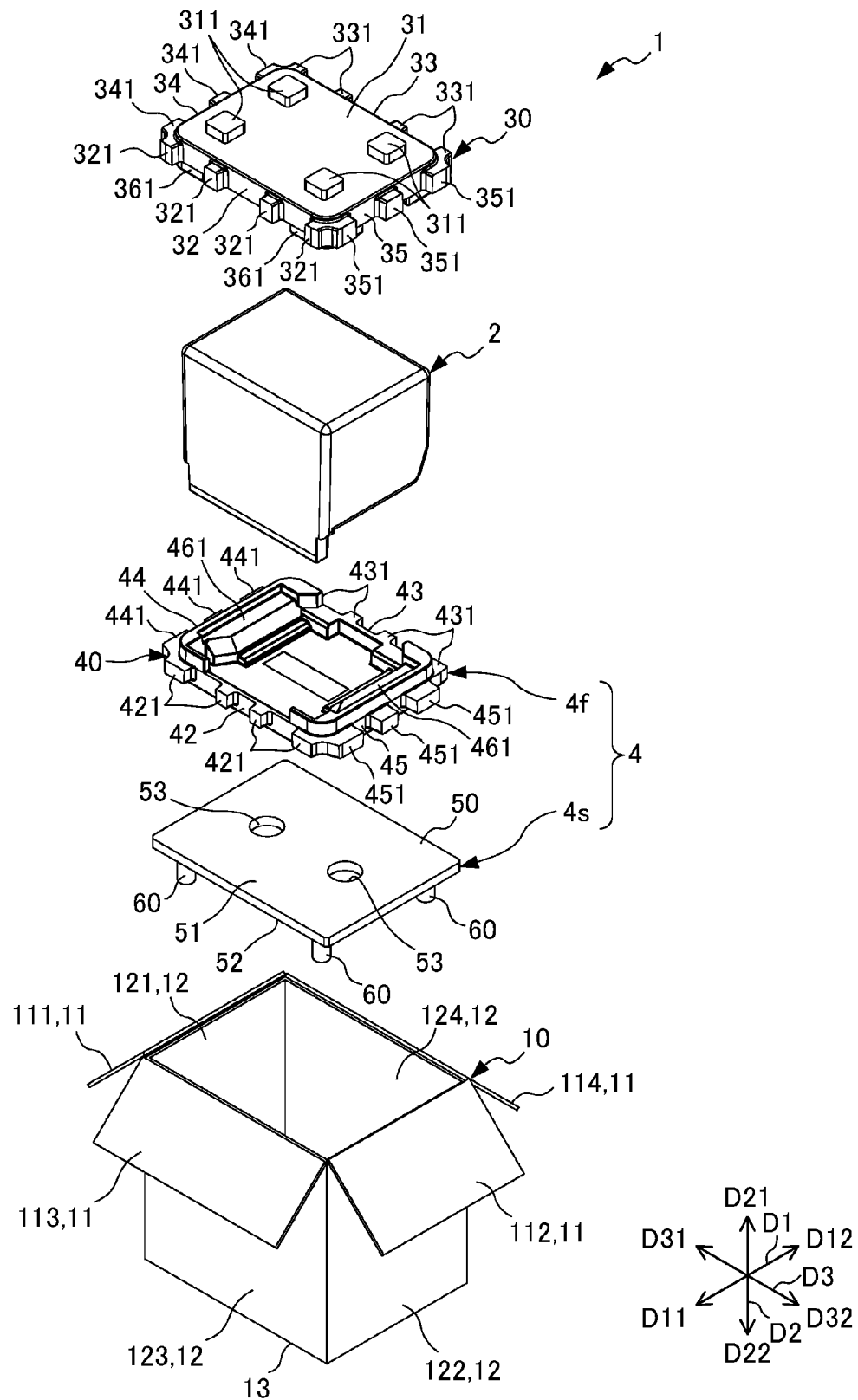
FIG. 1 is an exploded perspective view illustrating a packing structure 1 for packing a substrate storing container 2 according to the first embodiment of the present invention.
Figure 2:
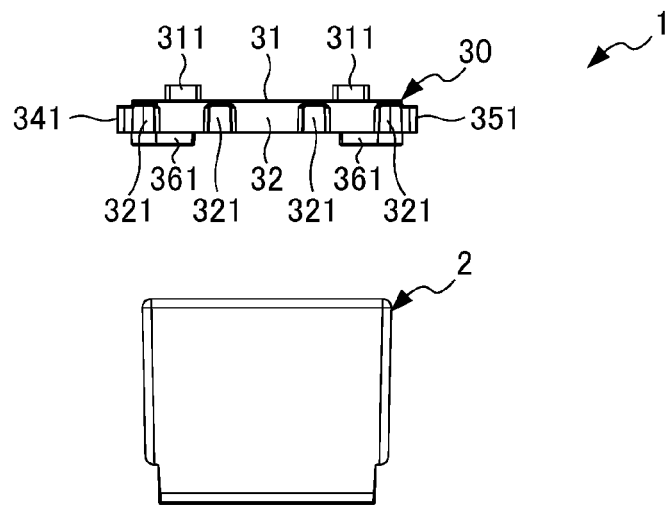
FIG. 2 is an exploded front view illustrating the packing structure 1 for packing the substrate storing container 2 according to the first embodiment of the present invention.
Figure 2:
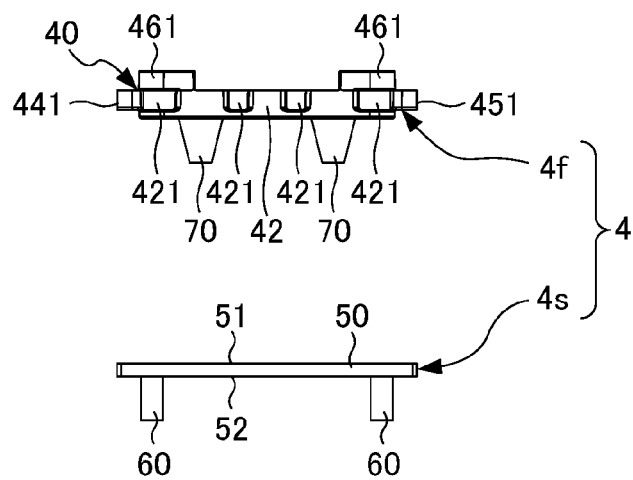
Figure 2:
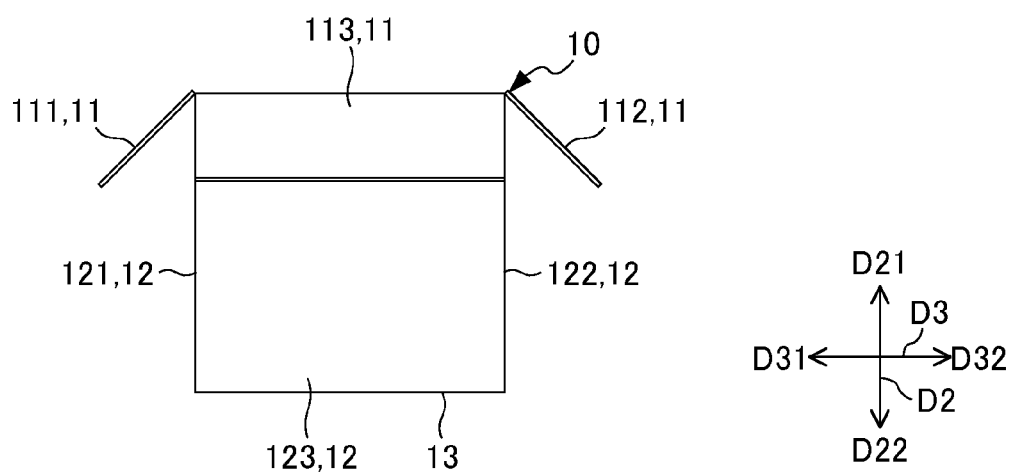
Figure 3A:
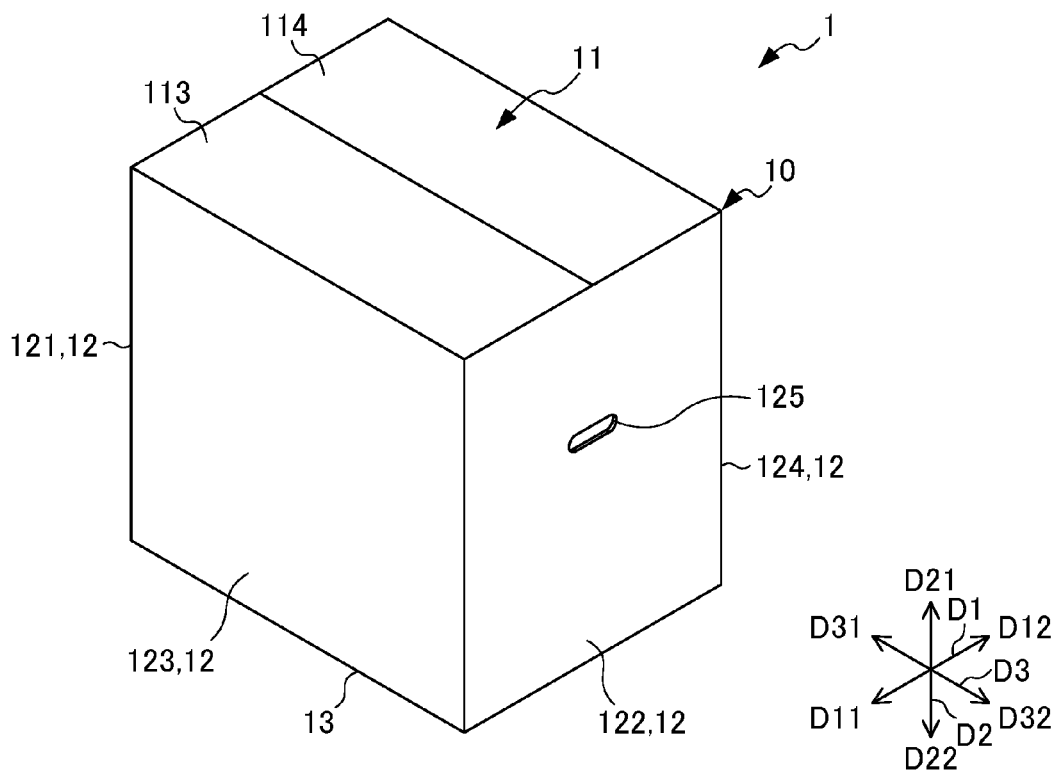
FIG. 3A is a perspective view illustrating the packing structure 1 for packing the substrate storing container 2 according to the first embodiment of the present invention as seen from diagonally above.
Figure 3B:
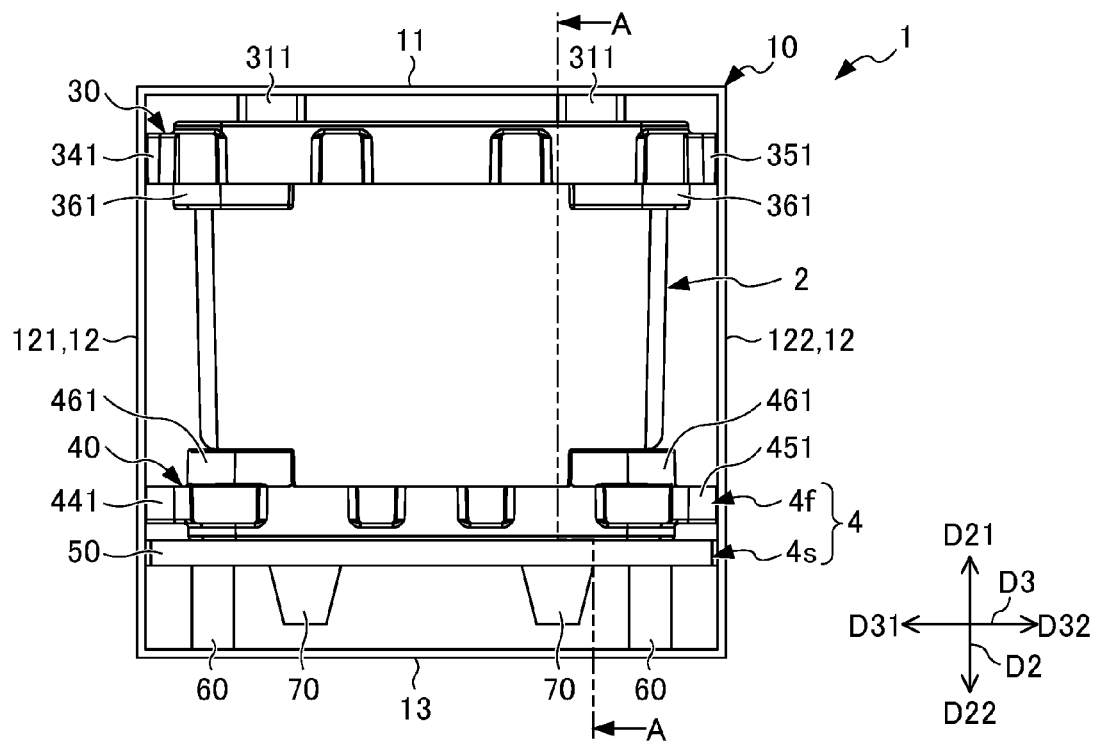
FIG. 3B is a front view illustrating the packing structure 1 of FIG. 3A in which a front plate 123 of a packing box 10 is omitted.
Figure 4A:
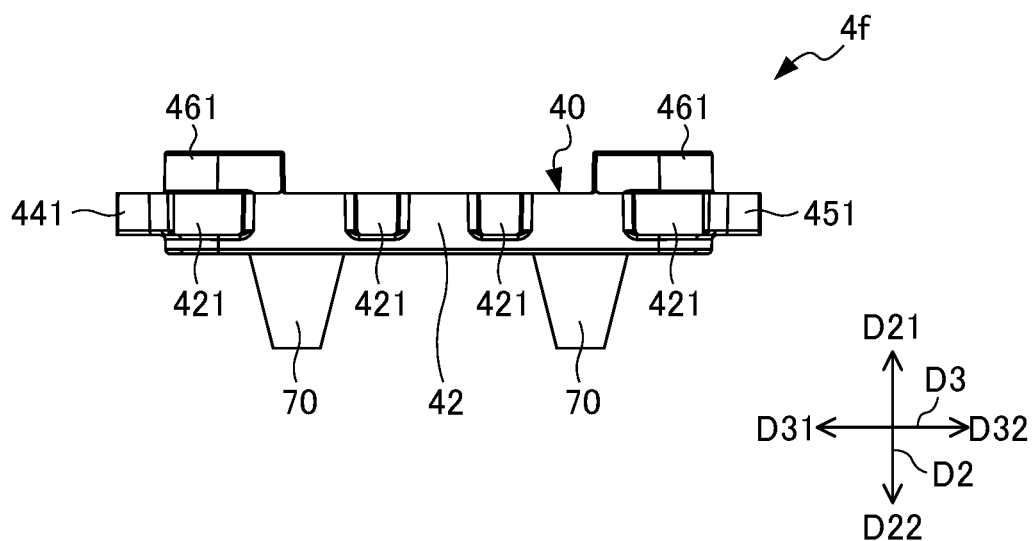
FIG. 4A is a front view illustrating a first cushioning portion 4f of a lower cushioning material 4 in the packing structure 1 according to the first embodiment of the present invention.
Figure 4B:
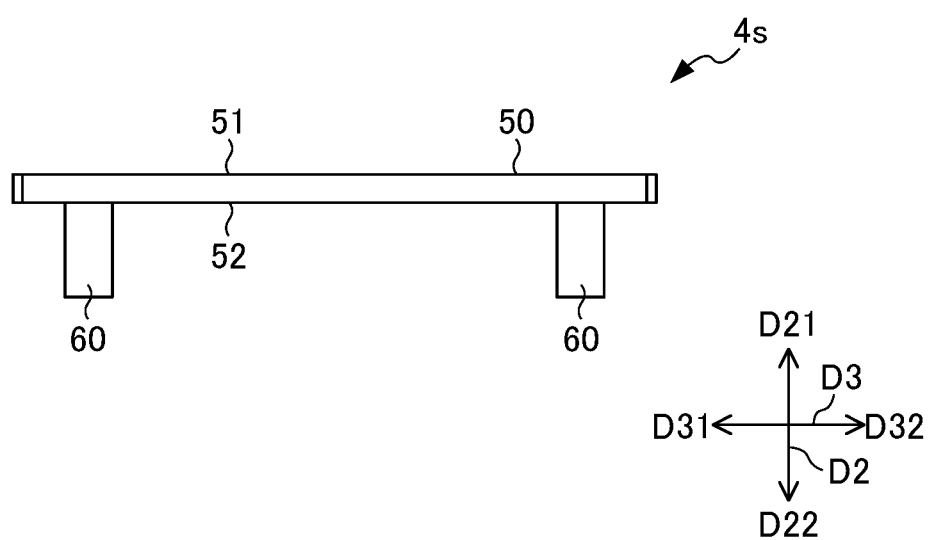
FIG. 4B is a front view illustrating a second cushioning portion 4s of the lower cushioning material 4 in the packing structure 1 according to the first embodiment of the present invention.
Figure 5A:
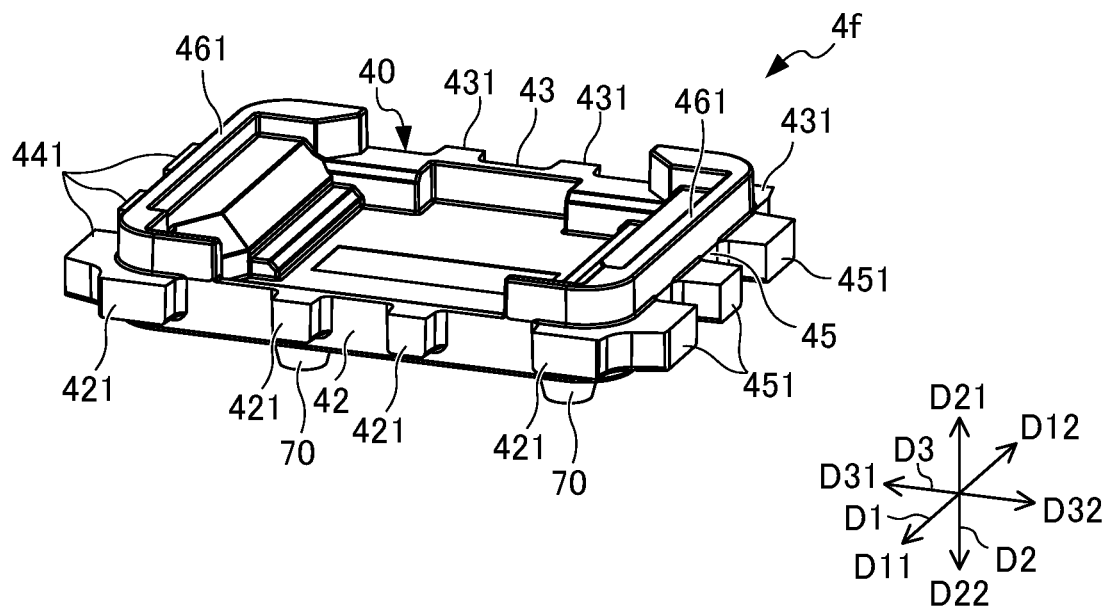
FIG. 5A is a perspective view of the first cushioning portion 4f of FIG. 4A as seen from above diagonally.
Figure 5B:
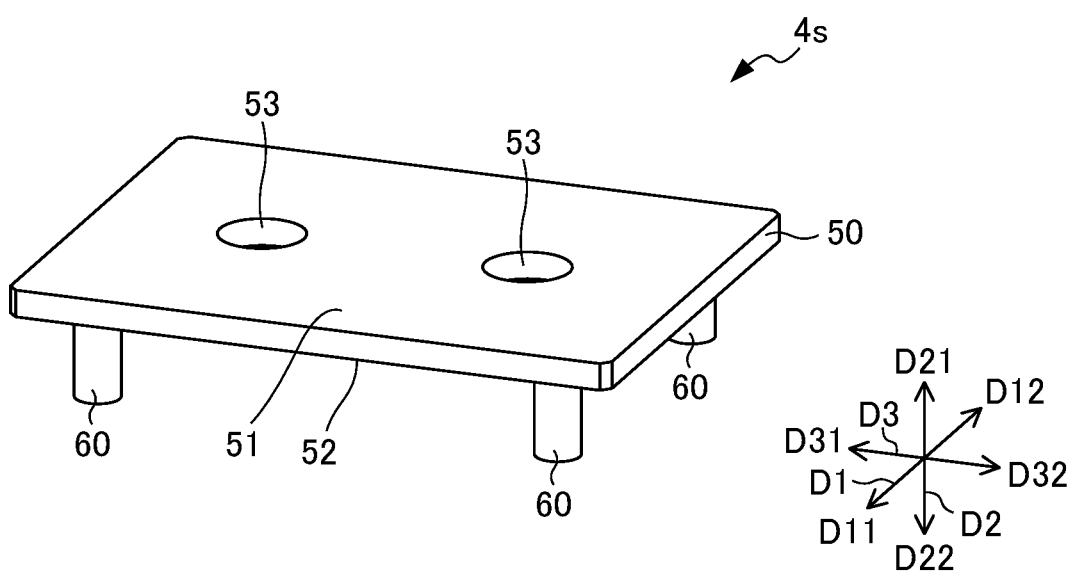
FIG. 5B is a perspective view of the second cushioning portion 4s of FIG. 4B as seen from above diagonally.
Figure 6A:
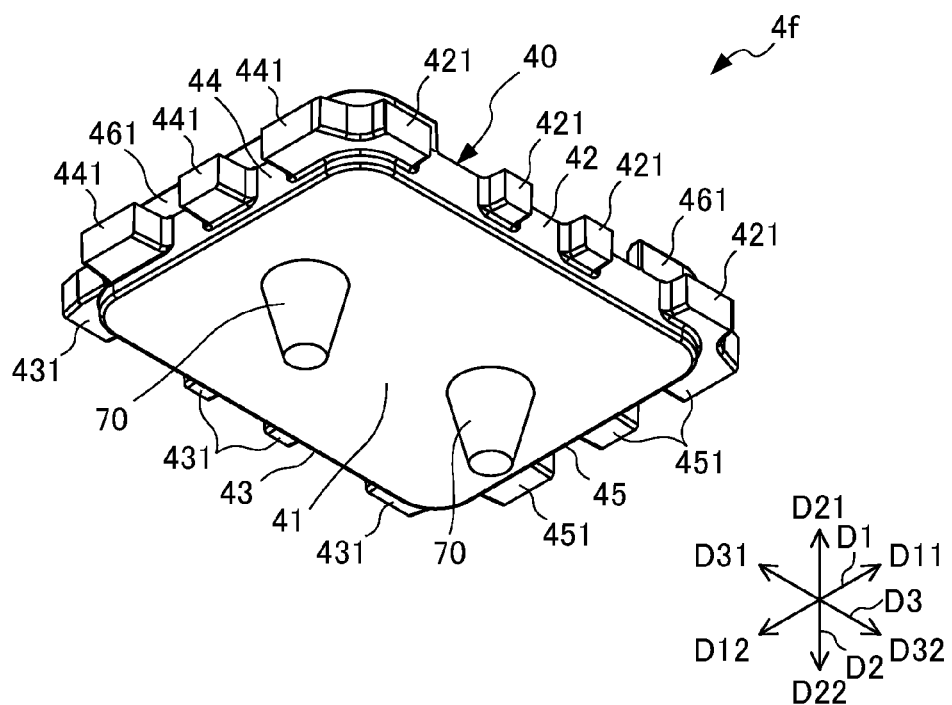
FIG. 6A is a perspective view of the first cushioning portion 4f of FIG. 4A as seen from below diagonally.
Figure 6B:
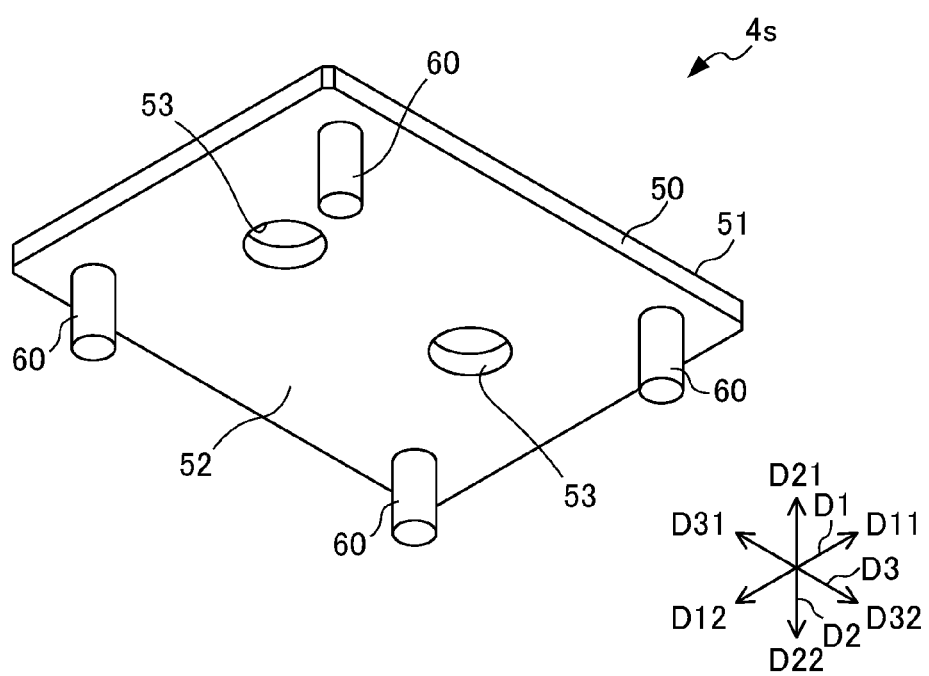
FIG. 6B is a perspective view of the second cushioning portion 4s of FIG. 4B as seen from below diagonally.
Figure 7A:
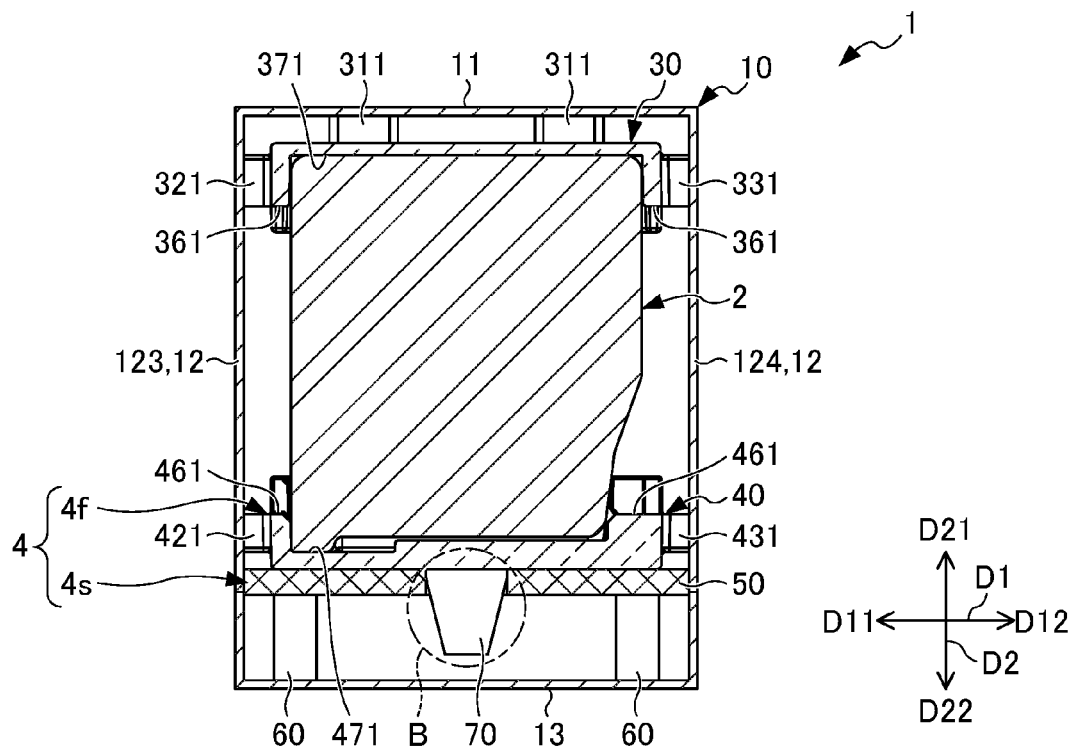
FIG. 7A is a longitudinal cross-sectional side view along the line A-A of FIG. 3B.
Figure 7B:
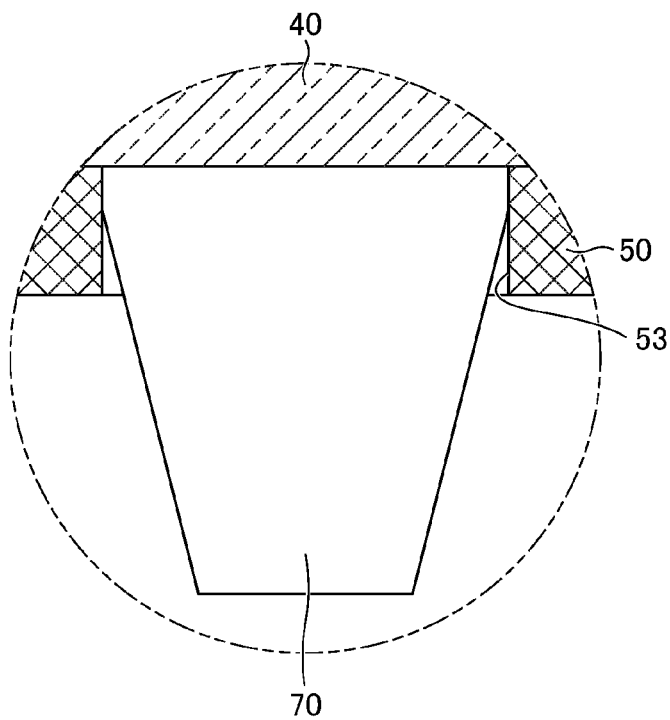
FIG. 7B is an enlarged view of a part B of FIG. 7A.
Figure 8:
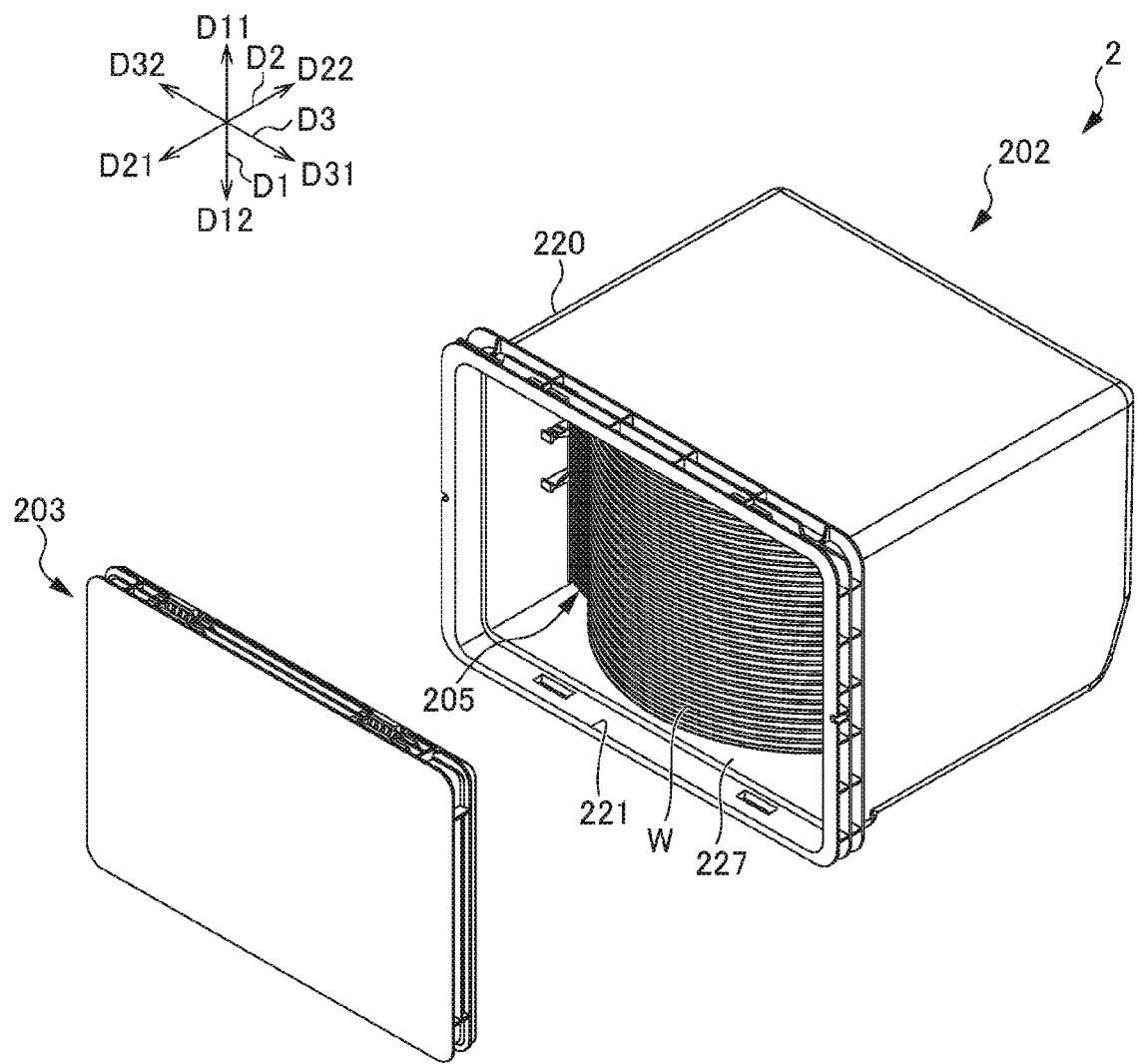
FIG. 8 is an exploded perspective view illustrating the substrate storing container 2 packed by the packing structure 1 according to the first embodiment of the present invention.
Figure 9:
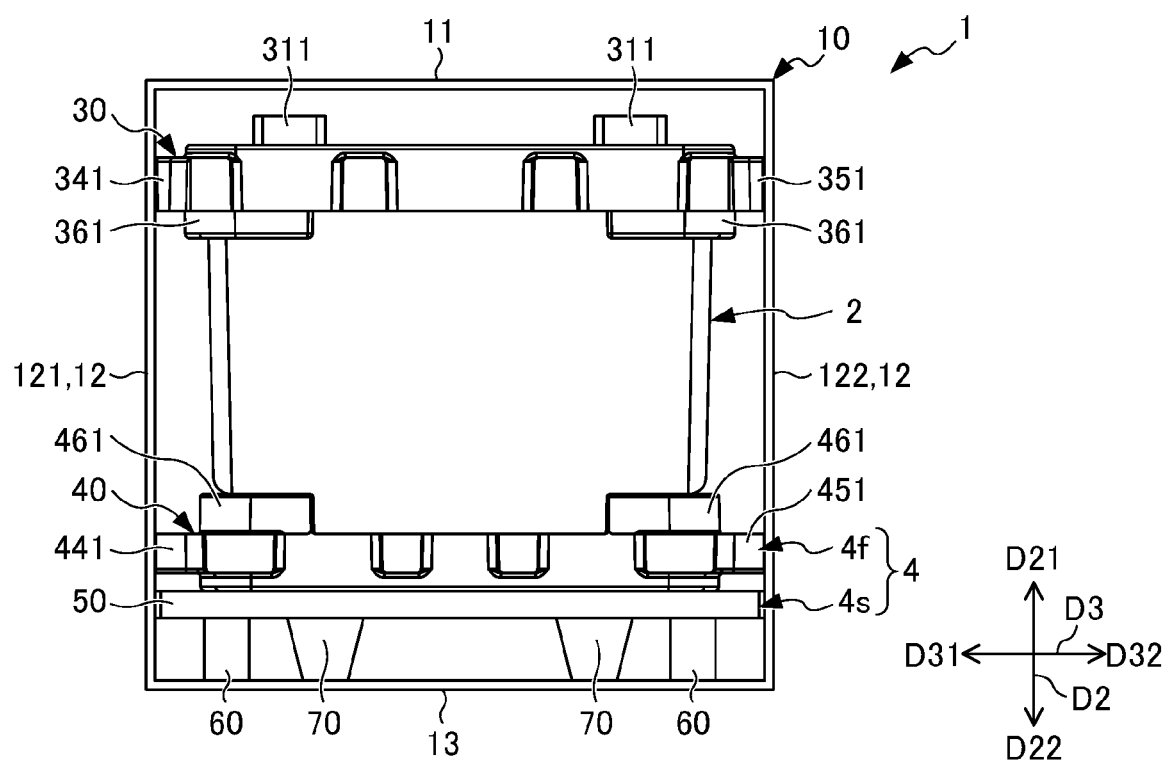
FIG. 9 is a front view, similar to FIG. 3B, illustrating a state in which the packing structure 1 according to the first embodiment of the present invention has fallen and a cushioning leg portion 60 of the second cushioning portion 4s has shrunk, and a cushioning-portion connecting portion 70 of the first cushioning portion 4f has reached a bottom plate 13 of a packing box 10.

In the following, a packing structure 1 for packing a substrate storing container according to a first embodiment of the present invention will be described with reference to the drawings. FIG. 1 is an exploded perspective view illustrating a packing structure 1 for packing a substrate storing container 2 according to the first embodiment of the present invention. FIG. 2 is an exploded front view illustrating the packing structure 1 for packing the substrate storing container 2 according to the first embodiment of the present invention. FIG. 3A is a perspective view illustrating the packing structure 1 for packing the substrate storing container 2 according to the first embodiment of the present invention as seen from diagonally above. FIG. 3B is a front view illustrating the packing structure 1 of FIG. 3A in which a front plate of a packing box is omitted. FIG. 4A is a front view illustrating a first cushioning portion of a lower cushioning material in the packing structure 1 according to the first embodiment of the present invention. FIG. 4B is a front view illustrating a second cushioning portion of the lower cushioning material in the packing structure 1 according to the first embodiment of the present invention. FIG. 5A is a perspective view of the first cushioning portion of FIG. 4A as seen from above diagonally. FIG. 5B is a perspective view of the second cushioning portion of FIG. 4B as seen from above diagonally. FIG. 6A is a perspective view of the first cushioning portion of FIG. 4A as seen from below diagonally. FIG. 6B is a perspective view of the second cushioning portion of FIG. 4B as seen from below diagonally. FIG. 7A is a longitudinal cross-sectional side view along the line A-A of FIG. 3B. FIG. 7B is an enlarged view of a part B of FIG. 7A. FIG. 8 is an exploded perspective view illustrating the substrate storing container 2 packed by the packing structure 1 according to the first embodiment of the present invention. FIG. 9 is a front view, similar to FIG. 3B, illustrating a state in which the packing structure 1 according to the first embodiment of the present invention has fallen and a cushioning leg portion of the second cushioning portion has shrunk, and a cushioning-portion connecting portion of the first cushioning portion has reached a bottom plate of a packing box.

Herein, for convenience of explanation, the direction from a back plate 124 toward a front plate 123 of a packing box 10 (described later) (lower left direction in FIG. 1) is defined as a forward direction D11, and the opposite direction to the direction D11 is defined as a backward direction D12. Furthermore, these directions are defined as a forward/backward direction D1. Furthermore, the direction from a bottom plate 13 toward a top plate 11 (described later) (upper direction in FIG. 1) is defined as an upper direction D21, and the direction opposite to the direction D21 is defined as a lower direction D22. In addition, these directions are defined as an upper/lower direction D2. Furthermore, the direction from a right plate 122 toward a left plate 121 (described later) (upper left direction in FIG. 1) is defined as a left direction D31, and the direction opposite to the direction D31 is defined as a right direction D32. Furthermore, these directions are defined as a left/right direction D3.

As illustrated in FIG. 8, the substrate storing container 2 packed by the packing structure 1 stores and transports substrates W composed of semiconductor wafers, and includes a container main body 202 and a lid body 203. It should be noted that, in FIG. 7A, illustration of the inside of the substrate storing container 2 is omitted for convenience of explanation.

The container main body 202 has a tubular wall portion 220 with a container main body opening portion 221 formed at one end and the other end closed. A substrate storing space 227 is formed in the container main body 202. The substrate storing space 227 is formed to be surrounded by the wall portion 220. A substrate support plate-like portion 205 and a rear retainer (not illustrated) are arranged at a part of the wall portion 220 that is a part forming the substrate storing space 227. A plurality of substrates W can be stored in the substrate storing container 227.

The substrate support plate-like portion 205 is provided at the wall portion 220 so as to form a pair in the substrate storing space 227. When the container main body opening portion 221 is not closed by the lid body 203, the substrate support plate-like portion 205 can support rim portions of the plurality of substrates W in a state in which adjacent substrates W are arranged in parallel to be spaced apart by a predetermined interval. The rear retainer (not illustrated) can support rear portions of the rim portions of the plurality of substrates W when the container main body opening portion 221 is closed by the lid body 203.

The lid body 203 can be removably attached to the container main body opening portion 221, and can close the container main body opening portion 221. A front retainer (not illustrated) is provided at the lid body 203. The front retainer (not illustrated) is a part of the lid body 203 and is provided at a part facing a portion which faces the substrate storing space 227 when the container main body opening portion 221 is closed by the lid body 203. The front retainer (not illustrated) is arranged so as to form a pair with the rear retainer (not illustrated).

The front retainer (not illustrated) can support front portions of the rim portions of the plurality of substrates W when the container main body opening portion 221 is closed by the lid body 203. The front retainer (not illustrated) retains the plurality of substrates W in a state in which adjacent substrates W are arranged in parallel to be spaced apart by a predetermined interval, by supporting the plurality of substrates W in cooperation with the rear retainer (not illustrated) when the container main body opening portion 221 is closed by the lid body 203.

The substrates W (refer to FIG. 8) stored in the substrate storing container 2 are disk-like silicon wafers, glass wafers, sapphire wafers, etc., and are thin members used for industrial use. The substrates W according to the present embodiment are silicon wafers having a diameter of 300 mm to 450 mm.

As illustrated in FIG. 1, the packing structure 1 for packing the substrate storing container 2 includes a packing box 10, an upper cushioning material 30, and a lower cushioning material 4. The lower cushioning material 4 is configured by combining a first cushioning portion 4f and a second cushioning portion 4s. The packing structure 1 packs the substrate storing container 2 in order to store and transport the substrates W composed of semiconductor wafers.

As illustrated in FIGS. 1, 2, 3A, etc., the packing box 10 is a type of so-called card board box composed of a so-called plastic card board box (known as "pladan"), includes a side plate 12, a top plate 11, and a bottom plate 13, and has a cuboid shape as a whole.

The side plate 12 is configured with the left plate 121, the right plate 122, the front plate 123, and the back plate 124 having a rectangular shape, respectively, has an axial center extending in the upper/lower direction, and has a square cylinder shape with both ends open. Through-holes 125 of oval shape which are made long in the forward/backward direction are formed in the left plate 121 and the right plate 122 of the side plate 12, respectively. An operator can pick up the packing box 10 by inserting a hand into the through-hole 125.

The top plate 11 continues to the respective upper rims of a left plate 121, a right plate 122, a front plate 123, and a back plate 124 of the side plate 12, and has four rectangular extending plates 111, 112, 113, and 114 that are separate from each other and extend upward. Each of these four extending plates 111, 112, 113, and 114 superimposes each other by being folded to inside by substantially an angle of 90 degrees from the upper rim with respect to the left plate 121, the right plate 122, the front plate 123, and the back plate 124, respectively, of the side plate 12 into which the four extending plates 111, 112, 113, and 114 continue. The four extending plates 111, 112, 113, and 114 in a state of superimposing each other constitute the top plate 11.

The bottom plate 13 continues into lower rim of the left plate 121, the right plate 122, the front plate 123, and the back plate 124, respectively, of the side plate 12 and has four rectangular extending plates (131, 132, 133, and 134, which, however, are omitted from illustration) that are separate from each other and extend downward. Each of these four extending plates superimposes each other by being folded inside by substantially an angle of 90 degrees from the lower rim with respect to the left plate 121, the right plate 122, the front plate 123, and the back plate 124 of the side plate 12 into which the four extending plates 111, 112, 113, and 114 continue. The four extending plates in a state of superimposing each other constitute the bottom plate 13.

The upper cushioning material 30 has rigidity which can retain the shape of the upper cushioning material 30 itself without being plastically deformed even when placing the substrate storing container 2 in which the substrates W are stored directly on the upper cushioning material 30. Furthermore, the upper cushioning material 30 is made of a material having flexibility that can absorb at least a part of an impact acting on the packing box 10 and transferred to the substrate storing container 2 via the upper cushioning material 30. Therefore, the upper cushioning material 30 will plastically deform and the shape will no longer return when receiving an impact stronger than a predetermined impact; however, it is possible to absorb impact weaker than a predetermined impact and not significantly deform with such an impact. In the present embodiment, the upper cushioning material 30 is made of styrene foam.

As illustrated in FIGS. 1, 2, etc., the upper cushioning material 30 has a substantially cuboid shape. Upward projecting convex portions 311 exist at an upper face 31 of the upper cushioning material 30. The upward projecting convex portions 311 are formed in the proximity of four corners of the upper face 31 of the upper cushioning material 30 in substantially rectangular shape, respectively, and have a substantially identical cuboid shape that projects upward, respectively. Therefore, as illustrated in FIGS. 3B and 7A, the upward projecting convex portions 311 are in contact with the top plate 11 of the packing box 10.

Four convex portions 321 of substantially cuboid shape project in the forward direction D11 at a side face 32 on the forward side of the upper cushioning material 30. Similarly, four convex portions 331 of substantially cuboid shape project in the backward direction D12 also at a side face 33 on the backward side of the upper cushioning material 30. Therefore, as illustrated in FIG. 7A, the convex portion 321 in the forward direction D11 is in contact with the front plate 123 of the packing box 10. The convex portion 331 in the backward direction D12 is in contact with the back plate 124 of the packing box 10.

Three convex portions 341 of substantially cuboid shape in the left direction D31 project at a side face 34 on the left side of the upper cushioning material 30. Similarly, three convex portions 351 in a substantially cuboid shape in the right direction D32 project at a side face 35 on the right side of the upper cushioning material 30. Therefore, as illustrated in FIG. 3B, the convex portion 341 in the left direction D31 is in contact with the left plate 121 of the packing box 10. The convex portion 351 in the right direction D32 is in contact with the right plate 122 of the packing box 10.

A convex portion 361 that projects in the lower direction D22 is provided at a lower face of the upper cushioning material 30. Therefore, a lower portion of the upper cushioning material 30 has a concave portion 371 (refer to FIG. 7A, etc.) which is relatively indented upwards in relation to the convex portion 361. The concave portion 371 has a shape which is substantially the same as the shape of an upper portion of the lid body 203 and an upper portion of the container main body 202 of the substrate storing container 2. By the upper cushioning material 30 being placed on the upper portion of the substrate storing container 2, the concave portion 371 is engaged with the upper portion of the lid body 203 and the upper portion of the container main body 202.

A first cushioning portion 4f of the lower cushioning material 4 includes a cushioning support portion 40 that is configured by a cushioning material and abuts directly the substrate storing container 2 to support the substrate storing container 2 and a cushioning portion connecting portion 70 that is configured by a cushioning material, connected to the cushioning support portion 40, and extends downward from the cushioning support portion 40.

The cushioning support portion 40 has rigidity which can retain the shape of the cushioning support portion 40 itself without being plastically deformed, even when placing the substrate storing container 2 in which the substrates W are stored directly on the cushioning support portion 40. Furthermore, the cushioning support portion 40 is made of a material having flexibility that can absorb at least a part of impact acting on the packing box 10 and transferred to the substrate storing container 2 via the cushioning support portion 40. In the present embodiment, the cushioning support portion 40 is made of styrene foam, which is the same material as that of the upper cushioning material 30.

The lower cushioning portion 40 has a substantially cuboid shape. A lower face 41 of the cushioning support portion 40 (refer to FIG. 6A, etc.) is configured with a plane face; however, two cushioning-portion connecting portions 70 project therefrom. The cushioning-portion connecting portions 70 are arranged at a predetermined interval in a longitudinal direction from the center of the lower face 41 of the cushioning support portion 40. The cushioning-portion connecting portion 70 may be configured with a material different from that of the cushioning support portion 40. In the present embodiment, the cushioning-portion connecting portion 70 is integrally formed with the cushioning support portion 40 by the same styrene foam as that of the cushioning support portion 40.

The form and size of the two cushioning-portion connecting portions 70 are identical. The cushioning-portion connecting portion 70 has a tapered cylindrical shape, i.e. truncated-conic shape, that gradually becomes narrower toward the lower end portion from the upper end portion, which continues into the cushioning support portion 40. The diameter of the cushioning-portion connecting portion 70 from the lower end portion to a portion just before the upper end portion is smaller than the diameter of the through-hole 53 of a cushioning plate-like portion 50 (described later) of the second cushioning portion 4s. The diameter of the cushioning-portion connecting portion 70 from a portion just before the upper end portion to the upper end portion is larger than the diameter of the through-hole 53 of the cushioning plate-like portion 50. For this reason, when the cushioning-portion connecting portion 70 is inserted into the through-hole 53 of the cushioning plate-like portion 50 from the lower end portion, a portion in the proximity of the upper end portion of the cushioning-portion connecting portion 70 is fitted by being pushed inwards in a radial direction by the through-hole 53 to be collapsed, whereby the first cushioning portion 4f and the second cushioning portion 4s are integrally fixed.

A convex portion 461 which projects in the upper direction D21 is provided at an upper face of the cushioning support portion 40. Therefore, an upper portion of the cushioning support portion 40 has a concave portion 471 (refer to FIG. 7A, etc.) which is relatively indented downwards in relation to the convex portion 461. The concave portion 471 has a shape which is substantially the same as the shape of a lower portion of the container main body 202 of the substrate storing container 2. The lower portion of the container main body 202 is engaged with the concave portion 471.

Four convex portions 421 of substantially cuboid shape project in the forward direction D11 at a side face 42 of the front side of the cushioning support portion 40. Similarly, four convex portions 431 of substantially cuboid shape project in the backward direction D12 at a side face 43 on the back side of the cushioning support portion 40. Therefore, as illustrated in FIG. 7A, the convex portion 421 in the forward direction D11 is brought into contact with the front plate 123 of the packing box 10. The convex portion 431 in the backward direction D12 is brought into contact with a back plate 124 of the packing box 10.

Three convex portions 441 (refer to FIG. 6A, etc.) of substantially cuboid shape project in the left direction D31 at a side face 44 on the left side of the cushioning support portion 40. Similarly, three convex portions 451 of substantially cuboid shape project in the right direction D32 at a side face 45 on the right side of the cushioning support portion 40. For this reason, as illustrated in FIG. 3B, the convex portion 441 in the left direction D31 is brought into contact with the left plate 121 of the packing box 10. The convex portion 451 in the right direction D32 is brought into contact with the right plate 122 of the packing box 10.

The second cushioning portion 4s of the lower cushioning material 4 includes a cushioning plate-like portion 50 in which the through-holes 53 are formed, and cushioning leg portions 60 which are configured by a cushioning material which is softer than the cushioning-portion connecting portion 70 of the first cushioning portion 4f and extend downwards from the cushioning plate-like portion 50.

The cushioning plate-like portion 50 has rigidity which can suppress the deformation of the cushioning support portion 40 and support the cushioning support portion 40 when the substrate storing container 2 is placed on the cushioning support portion 40 of the first cushioning portion 4f. In the present embodiment, the cushioning plate-like portion 50 is configured by a cardboard plate or a plastic plate. In other words, the cushioning plate-like portion 50 does not necessarily absorb vibration or impact by itself, and thus is configured by a relatively rigid material for which its own shape can be maintained. Therefore, the cushioning plate-like portion 50 is more rigid than the upper cushioning material 30 or the first cushioning portion 4f.

The cushioning plate-like portion 50 has a rectangular plate-like shape, and this rectangular shape is similar to the rectangular shape surrounded by the inner faces of the packing box 10 in a cross section of the packing box 10 made by cutting along a plane parallel with the left/right direction D3 and the forward/backward direction D1. Therefore, the cushioning plate-like portion 50 may be substantially in contact with any of the left plate 121, the right plate 122, the front plate 123, and the back plate 124 of the packing box 10 (refer to FIGS. 3B, 7A, etc.).

The cushioning plate-like portion 50 has a planar upper face 51 and a planar lower face 52, and two through-holes 53 penetrating between the upper face 51 and the lower face 52 are formed therein. The through-holes 53 are arranged at a predetermined interval in the longitudinal direction from the center of the cushioning plate-like portion 50. The locations of the two through-holes 53 correspond to the locations of the two cushioning-portion connecting portion 70 which project from the lower face 41 of the cushioning support portion 40 of the first cushioning portion 4f.

The cushioning leg portions 60 are fixed at the four corners of the lower face 52 of the cushioning plate-like portion 50. The material for the cushioning leg portions 60 is acceptable so long as being cushioning softer than the cushioning-portion connecting portion 70 made of styrene foam. In the present embodiment, the cushioning leg portions 60 are configured by coil springs having modulus of elasticity softer than the styrene foam of the cushioning-portion connecting portion 70. It should be noted that the spring coils 60 are illustrated in a simplified manner in the drawings.

The length of the coil spring 60 as the cushioning leg portion is determined so that the lower end portion of the cushioning-portion connecting portion 70 is located more upwards than the height of the lower end portion of the coil spring 60, when the cushioning-portion connecting portion 70 of the first cushioning portion 4f is inserted and fit into the through-hole 53 of the cushioning plate-like portion 50, and is fixed at a position at which the lower face 41 of the cushioning support portion 40 and the upper face 51 of the cushioning plate-like portion 50 contact with each other. For this reason, the first cushioning portion 4f and the second cushioning portion 4s are integrally combined with each other by configuring so that the cushioning-portion connecting portion 70 is inserted and fit into the through-hole 53 of the cushioning plate-like portion 50 for fixation up to the position at which the lower face 41 of the cushioning support portion 40 and the upper face 51 of the cushioning plate-like portion 50 are in contact with each other, and at this moment, the lower end portion of the cushioning-portion connecting portion 70 is located more upwards than the height of the lower end portion of the coil spring 60. With such a configuration, the lower cushioning material 4 is configured in which the first cushioning portion 4f and the second cushioning portion 4s are integrated.

In the lower cushioning material 4 configured by the first cushioning portion 4f and the second cushioning portion 4s being integrated, the entire lower cushioning material 4 is supported by the coil springs 60 as the cushioning leg portions. More specifically, the coil springs 60 support the cushioning plate-like portion 50. The cushioning plate-like portion 50 supports the cushioning support portion 40 in a state in which the cushioning-portion connecting portion 70 is inserted and fit into the through-hole 53 of the cushioning plate-like portion 50 and the lower face 41 of the cushioning support portion 40 and the upper face 51 of the cushioning plate-like portion 50 contact with each other.

Therefore, when arranging the lower cushioning material 4 in which the first cushioning portion 4f and the second cushioning portion 4s are integrated in the packing box 10 in a state of the top plate 11 being open, the lower end portion of the coil spring 60 is placed on the bottom plate 13 of the packing box 10 and the lower end portion of the cushioning-portion connecting portion 70 is located to be spaced apart upwards from the bottom plate 13. The substrate storing container 2 is placed in the concave portion 471 of the cushioning support portion 40 of this lower cushioning material 4. The upper cushioning material 30 is placed on an upper portion of this substrate storing container 2 so as to cover the concave portion 371 of the upper cushioning material 30. Then, the top plate 11 is closed. When this is done, as illustrated in FIGS. 3A, 3B, and 7A, the packing structure 1 that packs the substrate storing container 2 is configured.

Next, function of the packing structure 1 according to the first embodiment configured as above will be described.

As illustrated in FIGS. 3B and 7A, in the packing structure 1 that packs the substrate storing container 2, the upward projecting convex portion 311 of the upper cushioning material 30 is brought into contact with the top plate 11 of the packing box 10. The convex portion 321 of the upper cushioning material 30 in the forward direction D11 is brought into contact with the front plate 123 of the packing box 10, and the convex portion 331 in the backward direction D12 is brought into contact with the back plate 124 of the packing box 10. The convex portion 341 of the upper cushioning material 30 in the left direction D31 is brought into contact with the left plate 121 of the packing box 10, and the convex portion 351 in the right direction D32 is brought into contact with the right plate 122 of the packing box 10. The convex portion 421 in the forward direction D11 of the cushioning support portion 40 of the lower cushioning material 4 configured by the first cushioning portion 4f and the second cushioning portion 4s being integrated is brought into contact with the front plate 123 of the packing box 10, and the convex portion 431 in the backward direction D12 is brought into contact with the back plate 124 of the packing box 10. The convex portion 441 in the left direction D31 of the cushioning support portion 40 is brought into contact with the left plate 121 of the packing box 10, and the convex portion 451 in the right direction D32 is brought into contact with the right plate 122 of the packing box 10. Then, all of the constituent elements in the packing box 10 are supported by the coil springs 60 serving as the cushioning leg portions of the lower cushioning material 4.

When vibration is applied to the packing box 10 from outside the packing box 10, the vibration substantially propagates via the coil springs 60 to the substrate storing container 2 which is protected by the upper cushioning material 30 and the cushioning support portion 40 of the lower cushioning material 4 made of styrene foam. The coil springs 60 possess a function of absorbing and damping the vibration according to the modulus of elasticity. For this reason, the vibration applied to the packing box 10 does not propagate directly to the substrate storing container 2, but rather propagates to the substrate storing container 2 after being damped properly by the coil springs 60. Therefore, the vibration received by the substrate storing container 2 becomes weaker than the vibration applied to the packing box 10, and thus the risk of damaging the substrates W consisting of semiconductor wafers stored in the substrate storing container 2 is avoided.

By any chance, there may be a case in which the packing box 10 falls from a certain height. At this moment, if the lower cushioning material 4 only included the coil springs 60 below the cushioning plate-like portion 50, the coil springs 60 would receive impact from falling which greatly exceeds its vibration-absorption capability and thus be damaged, a result of which the cushioning plate-like portion 50 of a material that is more rigid than styrene foam (i.e. rigid body) would directly receive the impact from falling substantially. For this reason, the magnitude of impact propagating to the substrate storing container 2 from the cushioning plate-like portion 50 that is a rigid body directly receiving the impact from falling substantially is only slightly reduced by the cushioning support portion 40 made of styrene foam which is present between both. Therefore, the magnitude of the impact received by the substrate storing container 2 is a magnitude sufficient to cause significant damage to the substrates W made of semiconductor wafers stored in the substrate storing container 2, a result of which the substrates W are significantly damaged.

On the other hand, as illustrated in FIGS. 3B and 7A, the cushioning-portion connecting portion 70 made of styrene foam which projects from the lower face 41 of the cushioning support portion 40 extends downwards through the through-hole 53 of the cushioning plate-like portion 50 in the packing structure 1 according to the first embodiment. Furthermore, in a static state, the lower end portion of the cushioning-portion connecting portion 70 is located above to be spaced apart from the bottom plate 13 of the packing box 10. In a case of the packing box 10 falling from a certain height, as illustrated in FIG. 9, if the coil spring 60 cannot absorb the impact from falling and shrink, the lower end portion of the cushioning-portion connecting portion 70 made of styrene foam will abut the bottom plate 13 of the packing structure 10 and the impact from falling will be absorbed by the cushioning-portion connecting portion 70. At this moment, the cushioning support portion 40 similarly absorbs the impact from falling. For this reason, the impact from falling propagates to the substrate storing container 2 via the cushioning-portion connecting portion 70 and the cushioning support portion 40 made of styrene foam, without directly passing through the rigid cushioning plate-like portion 50. Therefore, the magnitude of the impact applied to the substrate storing container 2 is a magnitude that can be anticipated as not causing significant damage to the substrates W consisting of semiconductor wafers stored in the substrate storing container 2, a result of which the substrates W may avoid significant damage.

The following effects can be obtained according to the packing structure 1 according to the first embodiment of the abovementioned configuration.

The packing structure 1 is a packing structure for packing a substrate storing container 2 for storing and transporting substrates W composed of semiconductor wafers. The packing structure 1 includes a packing box 10; and a lower cushioning material 4 on which the substrate storing container 2 is placed in the packing box 10. The lower cushioning material 4 includes a first cushioning portion 4f and a second cushioning portion 4s. The first cushioning portion 4f includes: a cushioning support portion 40 that is configured by a cushioning material, and directly abuts the substrate storing container 2 to support the substrate storing container 2; and a cushioning-portion connecting portion 70 that is configured by a cushioning material, is connected to the cushioning support portion 40, and extends downwards from the cushioning support portion 40. The second cushioning portion 4s includes: a cushioning plate-like portion 50 in which a through-hole 53 is formed; and cushioning leg portions (coil springs) 60 which are configured by a cushioning material which is softer than the cushioning-portion connecting portion 70 of the first cushioning portion 4f, and extend downwards from the cushioning plate-like portion 50. Then, the cushioning plate-like portion 50 supports the first cushioning portion 4f in a state in which the cushioning-portion connecting portion 70 penetrates through the through-hole 53 of the cushioning plate-like portion 50.

With such a configuration, it is possible to provide the packing structure 1 for packing the substrate storing container 2 that can fix the first cushioning portion 4f and the second cushioning portion 4s without using an adhesive, in a case of using the first cushioning portion 4f and the second cushioning portion 4s configured by at least two different materials as the lower cushioning material 4 disposed in the packing box 10 of the substrate storing container 2, when transporting the substrate storing container 2. With such a configuration, it is possible to avoid the risk of outgas being generated when using an adhesive, and this outgas clinging to a packing bag of the substrate storing container 2 and being carried together upon brining the substrate storing container 2 into a clean room.

Furthermore, a lower end portion of the cushioning leg portion 60 of the second cushioning portion 4s is supported by the packing box 10, and a lower end portion of the cushioning-portion connecting portion 70 of the first cushioning portion 4f is not supported by the packing box 10, and is located more upwards than the lower end portion of the cushioning leg portion 60 and spaced apart from the packing box 10.

With such a configuration, when vibration is applied to the packing box 10 from outside the packing box 10, the vibration substantially propagates to the substrate storing container 2 via the cushioning leg portions 60 of the second cushioning portion 4s configured by cushioning material which is softer than that of the cushioning-portion connecting portion 70 of the first cushioning portion 4f. Since the cushioning leg portion 60 absorbs and attenuates the vibration, the vibration received the substrate storing container 2 is weaker than the vibration applied to the packing box 10. Therefore, it is possible to avoid the risk of causing damage to the substrates W consisting of semiconductor wafers stored in the substrate storing container 2. If by chance the packing box 10 falls from a certain height, the cushioning-portion connecting portion 70 and the cushioning support portion 40 of the first cushioning portion 4f can absorb the impact from falling. For this reason, it is possible for the substrates W to avoid significant damage.

Furthermore, the cushioning support portion 40 and the cushioning-portion connecting portion 70 of the first cushioning portion 4f are integrally formed from identical cushioning material. With such a configuration, it is possible to obtain the first cushioning portion 4f inexpensively.

Furthermore, a cushioning material that constitutes the cushioning leg portion 60 of the second cushioning portion 4s may be configured by any of a coil spring, an air spring, gel, sponge, rubber, and polymeric foam having elasticity. With such a configuration, it is possible to configure the second cushioning portion 4s using any cushioning material according to the specifications required in the packing structure 1 for packing the substrate storing container 2.

Furthermore, the cushioning plate-like portion 50 of the second cushioning portion 4s is configured by a rigid body that has a plate-like shape including a flat upper face 51 and a flat lower face 52 and can abut the cushioning support portion 40 of the first cushioning portion 4f, and has rigidity which can suppress deformation of the cushioning support portion 40 and support the cushioning support portion 40 when the substrate storing container 2 is placed on the cushioning support portion 40 of the first cushioning portion 4f. With such a configuration, it is possible to prevent deformation of the cushioning support portion 40 that abuts the substrate storing container 2 directly and supports the substrate storing container 2, and thus it is possible to prevent unacceptable external force from being applied to the substrate storing container 2.

Furthermore, a cushioning material that constitutes the cushioning leg portion 60 of the second cushioning portion 4s may be configured with a sponge in place of a coil spring. Then, the cushioning plate-like portion 50 of the second cushioning portion 4s may be configured by a sponge which is the same as the sponge constituting the cushioning leg portion 60, and the cushioning plate-like portion 50 and the cushioning leg portion 60 may be integrally formed. With such a configuration, it is possible to obtain the second cushioning portion 4s inexpensively.

Furthermore, the cushioning-portion connecting portion 70 of the first cushioning portion 4f is not adhered to the cushioning plate-like portion 50 of the second cushioning portion 4s, and is fixed to the cushioning plate-like portion 50 by fitting into the through-hole 53 of the cushioning plate-like portion 50. With such a configuration, it is possible to fix the first cushioning portion 4f and the second cushioning portion 4s without using an adhesive.

In the following, various combinations of the first cushioning portion 4f and the second cushioning portion 4s of the lower cushioning material 4 will be described.

In the abovementioned first embodiment, the cushioning support portion 40 and the cushioning-portion connecting portion 70 of the first cushioning portion 4f are made of the same styrene foam and are integrally formed. The shape of the cushioning-portion connecting portion 70 is a tapered cylindrical shape (truncated-conic shape) that gradually becomes narrower from the upper end portion to the lower end portion. The cushioning plate-like portion 50 of the second cushioning portion 4s is made of a rigid body which is more rigid than the styrene foam of the first cushioning portion 4f, and the shape of the through-hole 53 of the cushioning plate-like portion 50 is a cylindrical round hole. The cushioning leg portion 60 of the second cushioning portion 4s is configured by a coil spring having modulus of elasticity which is softer than styrene foam of the cushioning-portion connecting portion 70. This is a basic combination of the first cushioning portion 4f and the second cushioning portion 4s of the lower cushioning material 4.

Figure 10A:
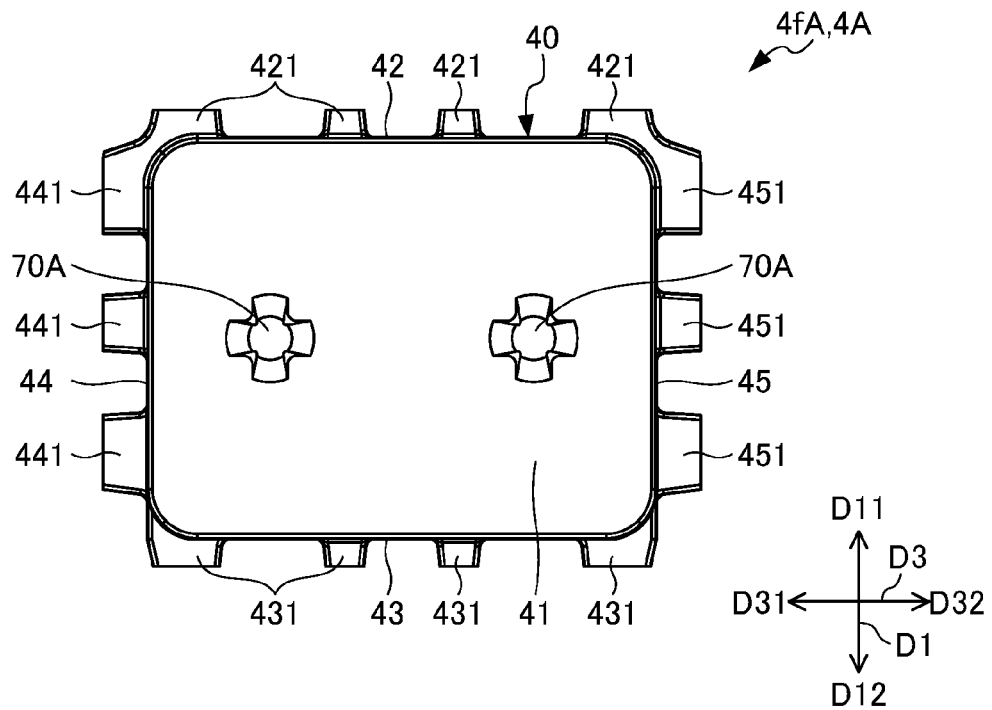
FIG. 10A is a bottom view illustrating a first cushioning portion 4fA of a lower cushioning material 4A in a packing structure 1 according to the second embodiment of the present invention.
Figure 10B:
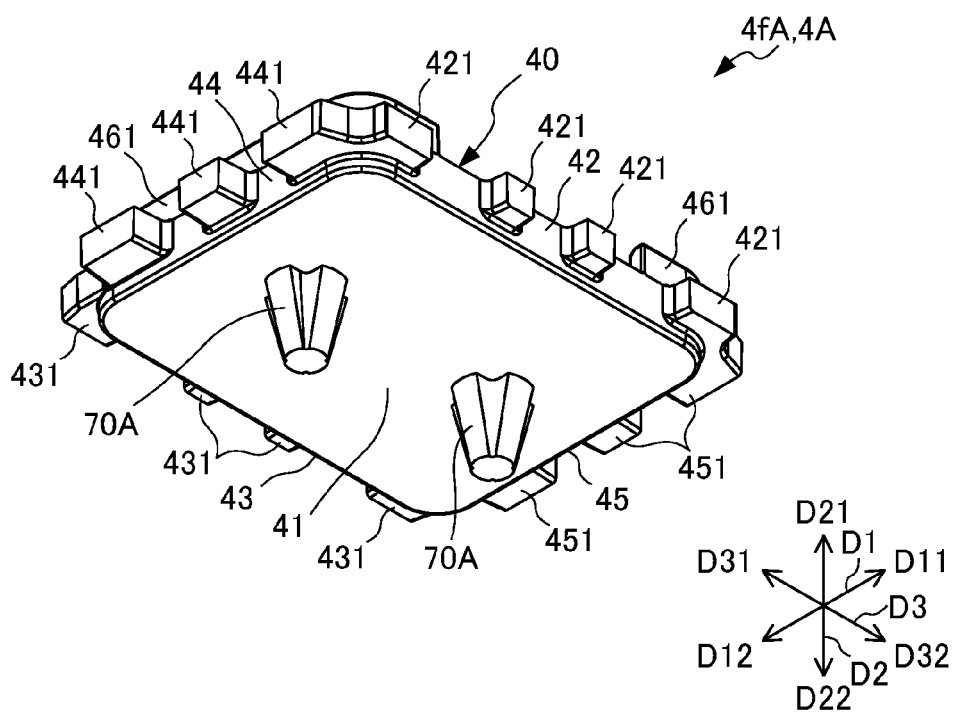
FIG. 10B is a perspective view of the first cushioning portion 4fA of FIG. 10A as seen from below diagonally.

FIG. 10A is a bottom view illustrating a first cushioning portion 4fA which is combined with a cushioning plate-like portion 50 having a through-hole 53 in a basic round hole shape in a lower cushioning material 4A of the second embodiment. FIG. 10B is a perspective view of the first cushioning portion 4fA of FIG. 10A as seen from below diagonally.

In the first cushioning portion 4fA of the second embodiment, the shape of the cushioning-portion connecting portion 70A is formed in a cross shape. More specifically, with the shape of the cushioning-portion connecting portion 70 of the first embodiment (truncated-conic shape) as its base, the upper end portion which continues into the cushioning support portion 40 has larger removed areas for forming a cross, and thus clearly exhibits a cross shape. As a horizontal cross-sectional area gradually decreases from the upper end portion toward the lower end portion, the removed areas for forming the cross gradually decrease, and thus only slight removed areas remain at the lower end portion. The cushioning-portion connecting portion 70A of the first cushioning portion 4fA is formed in such a shape. Regarding configurations other than this, due to being the same as the first embodiment, the same members are illustrated with the same reference numerals, and the descriptions thereof will be omitted.

In the case of the first cushioning portion 4fA of the second embodiment as well, the outside diameter in the cross shape from the lower end portion to a portion just before the upper end portion of the cushioning-portion connecting portion 70A is smaller than the diameter of the through-hole 53 of round hole shape in the cushioning plate-like portion 50 of the second cushioning portion 4s. The outside diameter of the cross shape of the cushioning-portion connecting portion 70A from a portion just before the upper end portion to the upper end portion is larger than the diameter of the through-hole 53 of round hole shape in the cushioning plate-like portion 50. For this reason, when the cushioning-portion connecting portion 70A is inserted into the through-hole 53 of the cushioning plate-like portion 50 from the lower end portion, a portion in the proximity of the upper end portion of the cushioning-portion connecting portion 70A is fitted by being pushed inwards in a radial direction by the through-hole 53 to be collapsed, whereby the first cushioning portion 4fA and the second cushioning portion 4s are integrally fixed.

Then, in the case of the first cushioning portion 4fA of the second embodiment as well, since it is integrally fixed with the second cushioning portion 4s by means of the fitting of the portion in the proximity of the cushioning-portion connecting portion 70A and the through-hole 53 of round hole shape in the cushioning plate-like portion 50, it functions similarly to the lower cushioning material 4 in the case of the first embodiment, and thus similar effects can be obtained.

Figure 11A:
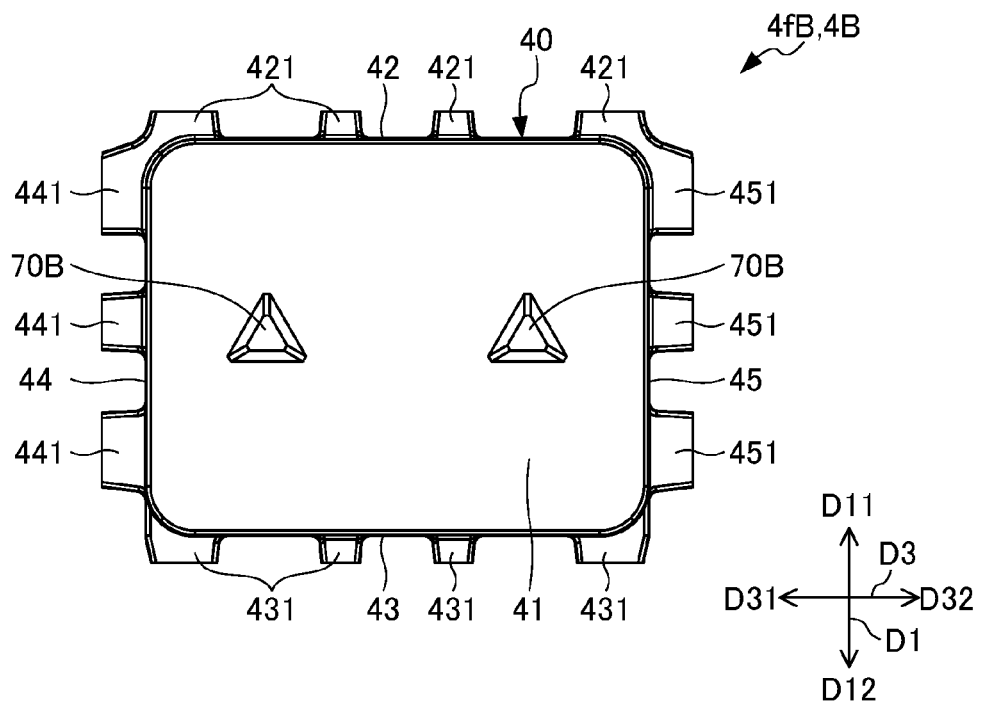
FIG. 11A is a bottom view illustrating a first cushioning portion 4fB of a lower cushioning material 4B in a packing structure 1 according to the third embodiment of the present invention.
Figure 11B:
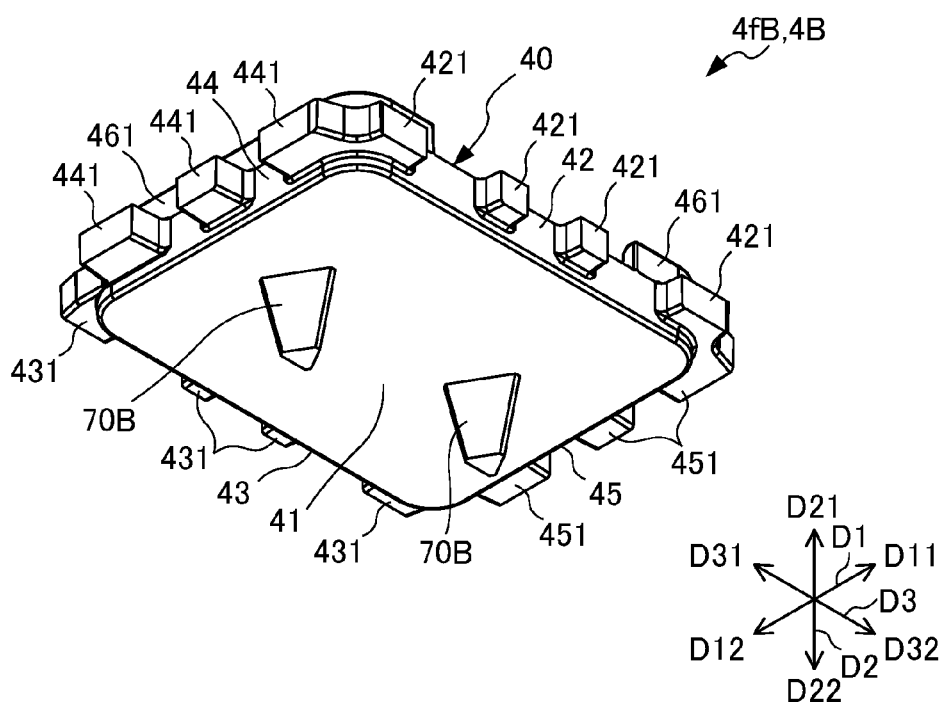
FIG. 11B is a perspective view of the first cushioning portion 4fB of FIG. 11A as seen from below diagonally.

FIG. 11A is a bottom view illustrating a first cushioning portion 4fB which is combined with a cushioning plate-like portion 50 having a through-hole 53 of basic round hole shape in a lower cushioning material 4B of the third embodiment. FIG. 11B is a perspective view of the first cushioning portion 4/B of FIG. 11A as seen from below diagonally.

In the first cushioning portion 4/B of the third embodiment, the shape of the cushioning-portion connecting portion 70B is formed in a triangular shape. More specifically, with the shape of the cushioning-portion connecting portion 70 of the first embodiment (truncated-conic shape) as its base, the upper end portion which continues into the cushioning support portion 40 exhibits a large triangle, and as the horizontal cross-sectional area gradually decreases from the upper end portion toward the lower end portion, the size of the triangle gradually decreases, and thus the lower end portion exhibits the smallest triangle. The cushioning-portion connecting portion 70B of the first cushioning portion 4/B is formed in such a shape, i.e., a truncated-conic shape. Regarding the configurations other than this, due to being the same as the first embodiment, the same members are illustrated with the same reference numerals, and the descriptions thereof will be omitted.

In the case of the first cushioning portion 4/B of the third embodiment as well, the outside diameter in the triangle shape of the cushioning-portion connecting portion 70B from the lower end portion to a portion just before the upper end portion is smaller than the diameter of the through-hole 53 of round hole shape in the cushioning plate-like portion 50 of the second cushioning portion 4s. The outside diameter of the cushioning-portion connecting portion 70B in a triangle shape from a portion just before the upper end portion to the upper end portion is larger than the diameter of the through-hole 53 of round hole shape in the cushioning plate-like portion 50. For this reason, when the cushioning-portion connecting portion 70B is inserted into the through-hole 53 of the cushioning plate-like portion 50 from the lower end portion, a portion in the proximity of the upper end portion of the cushioning-portion connecting portion 70B is fitted by being pushed inwards in a radial direction to be collapsed by the through-hole 53. In this way, the first cushioning portion 4/B and the second cushioning portion 4s are integrally fixed.

Then, in the case of the first cushioning portion 4/B of the third embodiment as well, since it is integrally fixed with the second cushioning portion 4s by means of the fitting of the portion in the proximity of the cushioning-portion connecting portion 70B and the through-hole 53 of round hole shape in the cushioning plate-like portion 50, it functions similarly to the lower cushioning material 4 in the case of the first embodiment, and thus similar effects can be obtained.

Figure 12A:
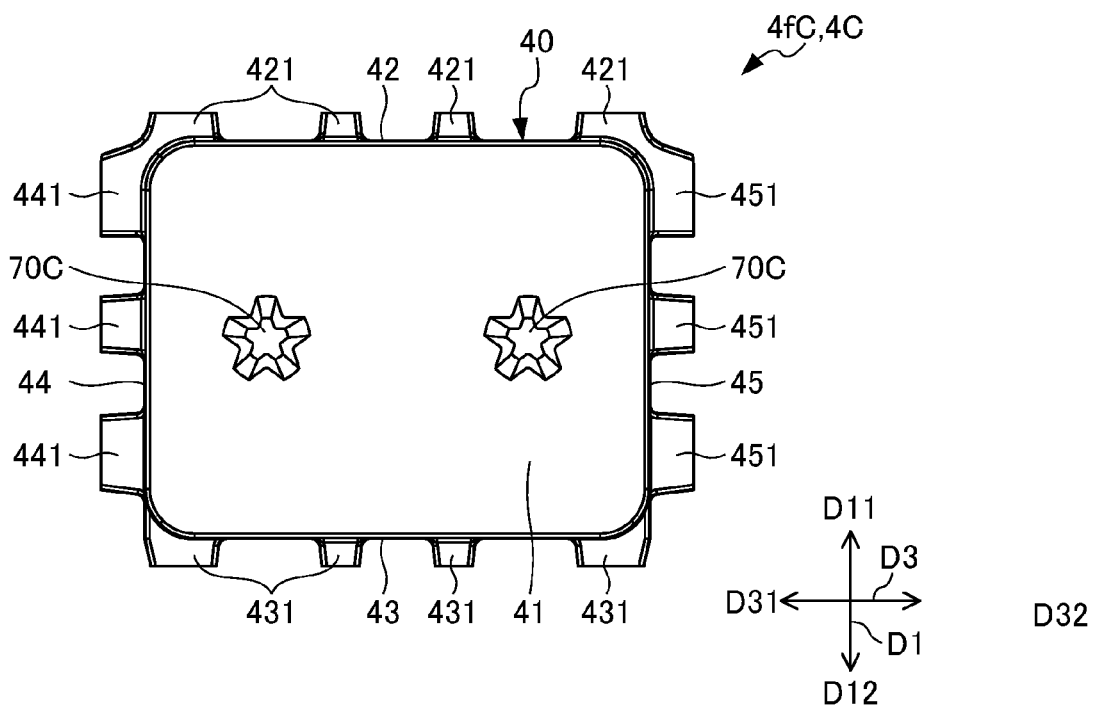
FIG. 12A is a bottom view illustrating a first cushioning portion 4fC of a lower cushioning material 4C in a packing structure 1 according to the fourth embodiment of the present invention.
Figure 12B:
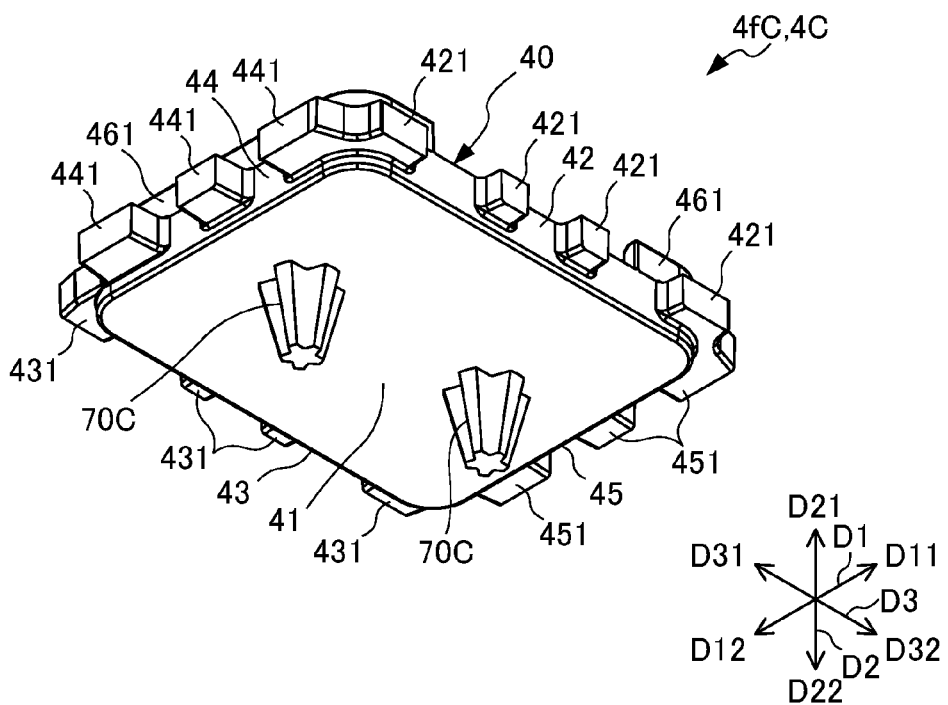
FIG. 12B is a perspective view of the first cushioning portion 4fC of FIG. 12A as seen from below diagonally.

FIG. 12A is a bottom view illustrating a first cushioning portion 4/C which is combined with a cushioning plate-like portion 50 having a through-hole 53 of basic round hole shape in a lower cushioning material 4C of the fourth embodiment. FIG. 12B is a perspective view of the first cushioning portion 4/C of FIG. 12A as seen from below diagonally.

In the first cushioning portion 4/C of the fourth embodiment, the shape of the cushioning-portion connecting portion 70C is formed in a star shape. More specifically, with the shape of the cushioning-portion connecting portion 70 of the first embodiment (truncated-conic shape) as its base, the upper end portion which continues into the cushioning support portion 40 exhibits a large star shape, and as the horizontal cross-sectional area gradually decreases from the upper end portion toward the lower end portion, the size of the star shape gradually decreases, and thus the lower end portion exhibits the smallest star shape. The cushioning-portion connecting portion 70C of the first cushioning portion 4/C is formed in such a shape. Regarding the configurations other than this, due to being the same as the first embodiment, the same members are illustrated with the same reference numerals, and the descriptions thereof will be omitted.

In the case of the first cushioning portion 4/C of the fourth embodiment as well, the outside diameter of the cushioning-portion connecting portion 70C in the star shape from the lower end portion to a portion just before the upper end portion is smaller than the diameter of the through-hole 53 of round hole shape in the cushioning plate-like portion 50 of the second cushioning portion 4s. The outside diameter in a star shape of the cushioning-portion connecting portion 70C from a portion just before the upper end portion to the upper end portion is larger than the diameter of the through-hole 53 of round hole shape in the cushioning plate-like portion 50. For this reason, when the cushioning-portion connecting portion 70C is inserted into the through-hole 53 of the cushioning plate-like portion 50 from the lower end portion, a portion in the proximity of the upper end portion of the cushioning-portion connecting portion 70C is fitted by being pushed inwards in a radial direction to be collapsed by the through-hole 53. In this way, the first cushioning portion 4/C and the second cushioning portion 4s are integrally fixed.

Then, in the case of the first cushioning portion 4/C of the fourth embodiment as well, since it is integrally fixed with the second cushioning portion 4s by means of the fitting of the portion in the proximity of the cushioning-portion connecting portion 70C and the through-hole 53 of round hole shape in the cushioning plate-like portion 50, it functions similarly to the lower cushioning material 4 in the case of the first embodiment, and thus similar effects can be obtained.

Figure 13A:
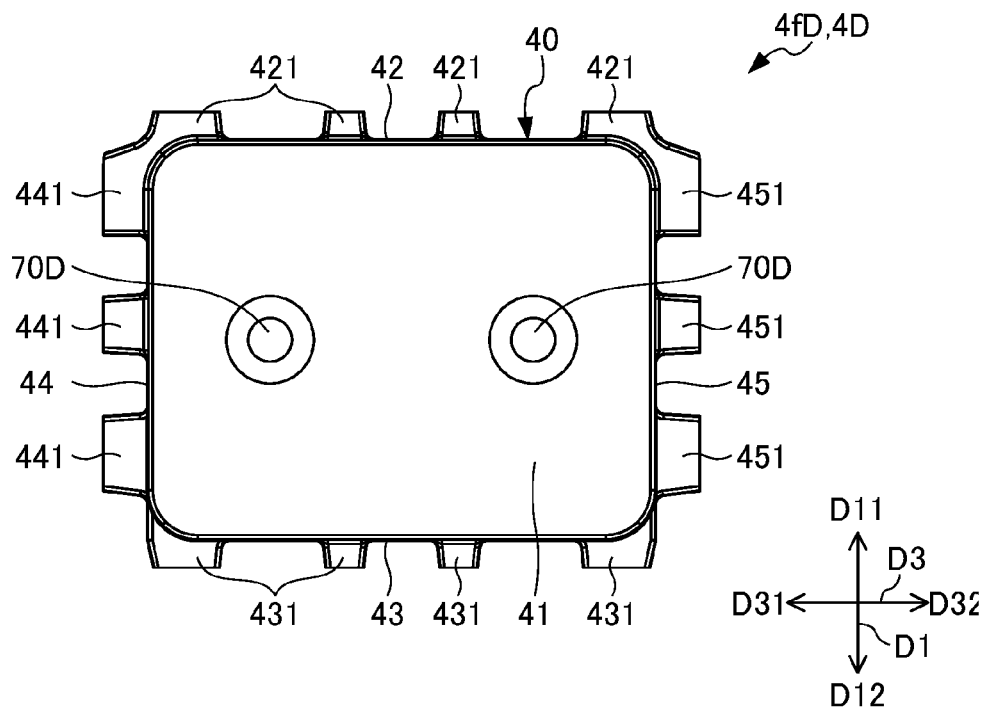
FIG. 13A is a bottom view illustrating a first cushioning portion 4fD of a lower cushioning material 4D in the packing structure 1 according to the fifth embodiment of the present invention.
Figure 13B:
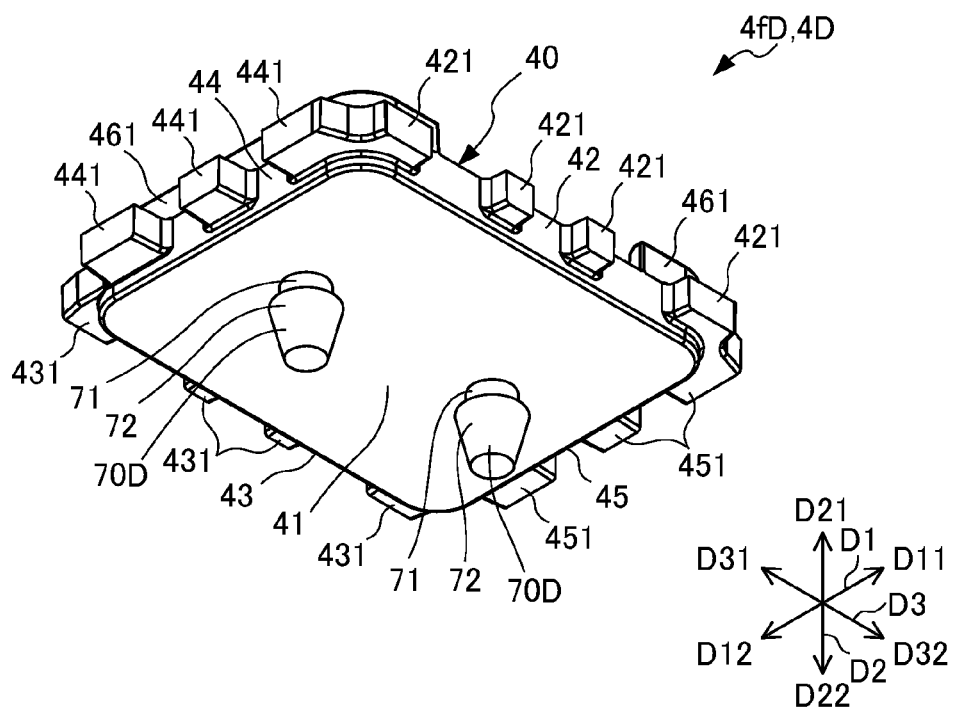
FIG. 13B is a perspective view of the first cushioning portion 4fD of FIG. 13A as seen from below diagonally.
Figure 14A:
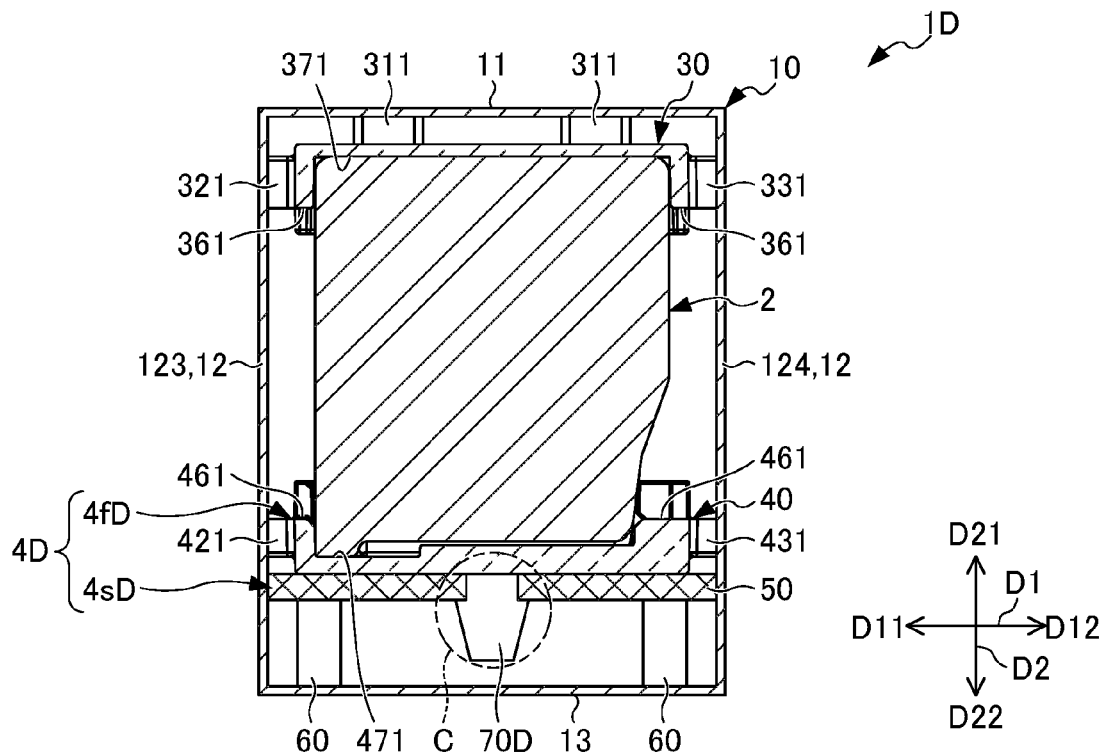
FIG. 14A is a longitudinal cross-sectional side view, similar to FIG. 7A, illustrating an aspect of fixing the first cushioning portion 4fD and a second cushioning portion 4sD in a packing structure 1D according to the fifth embodiment of the present invention.
Figure 14B:
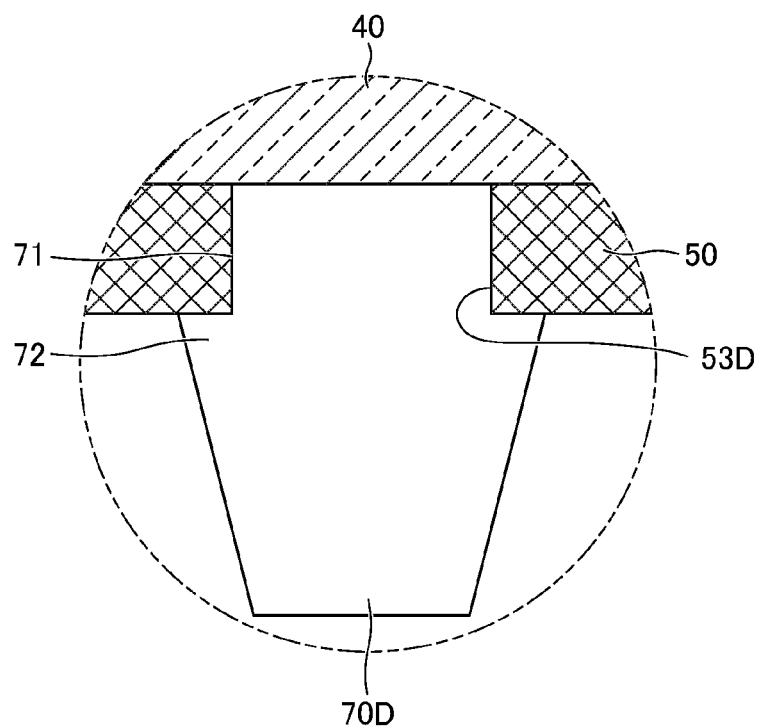
FIG. 14B is an enlarged view of a part C of FIG. 14A.

FIG. 13A is a bottom view illustrating a first cushioning portion 4/D which is combined with a cushioning plate-like portion 50 having a through-hole 53 of basic round hole shape in a lower cushioning material 4D of the fifth embodiment. FIG. 13B is a perspective view of the first cushioning portion 4/D of FIG. 13A as seen from below diagonally. FIG. 14A is a longitudinal cross-sectional side view, similar to FIG. 7A, illustrating an aspect of fixing the first cushioning portion 4/D and a second cushioning portion 4sD of a lower cushioning material 4D of the fifth embodiment. FIG. 14B is an enlarged view of a part C of FIG. 14A.

In the first cushioning portion 4/D of the fifth embodiment, the shape of the cushioning-portion connecting portion 70D is formed in a truncated-conic shape with a barb. More specifically, with the shape of the cushioning-portion connecting portion 70 of the first embodiment (truncated-conic shape) as its base, a cylindrical small diameter portion 71 is formed at the upper end portion which continues into the cushioning support portion 40, and a barb portion 72 having a larger diameter than the small diameter portion 71 is formed at a portion continuing into the lower end portion of the small diameter portion 71. It should be noted that the outside diameter of the small diameter portion 71 is larger than the outside diameter of the lower end portion of the cushioning-portion connecting portion 70D, and the length of the small diameter portion 71 is formed to be a length corresponding to the length of a through-hole 53D in a cushioning plate-like portion 50 (described later). Furthermore, in the case of the fifth embodiment, the diameter of the through-hole 53D in the cushioning plate-like portion 50 is formed to be a size corresponding to the outside diameter of the small diameter portion 71 of the cushioning-portion connecting portion 70D. Regarding the configurations other than this, due to being the same as the first embodiment, the same members are illustrated with the same reference numerals, and the descriptions thereof will be omitted.

In the case of the first cushioning portion 4fD of the fifth embodiment, when the cushioning-portion connecting portion 70D is inserted into the through-hole 53D in the cushioning plate-like portion 50 from the lower end portion, styrene foam of a slightly lower portion of the barb portion 72 over the barb portion 72 of the cushioning-portion connecting portion 70D is collapsed while passing through the through-hole 53D. When the small diameter portion 71 is held inside of the through-hole 53D, the styrene foam of the barb portion 72 expands to a larger diameter than the through-hole 53D so that the small diameter portion 71 and the through-hole 53D fit, whereby the first cushioning portion 4fD and the second cushioning portion 4sD are integrally fixed.

Then, in the case of the first cushioning portion 4fD of the fifth embodiment as well, since it is integrally fixed with the second cushioning portion 4sD by means of the fitting of the small diameter portion 71 of the cushioning-portion connecting portion 70D and the through-hole 53D of round hole shape in the cushioning plate-like portion 50, it functions similarly to the lower cushioning material 4 in the case of the first embodiment, and thus similar effects can be obtained.

Figure 15A:
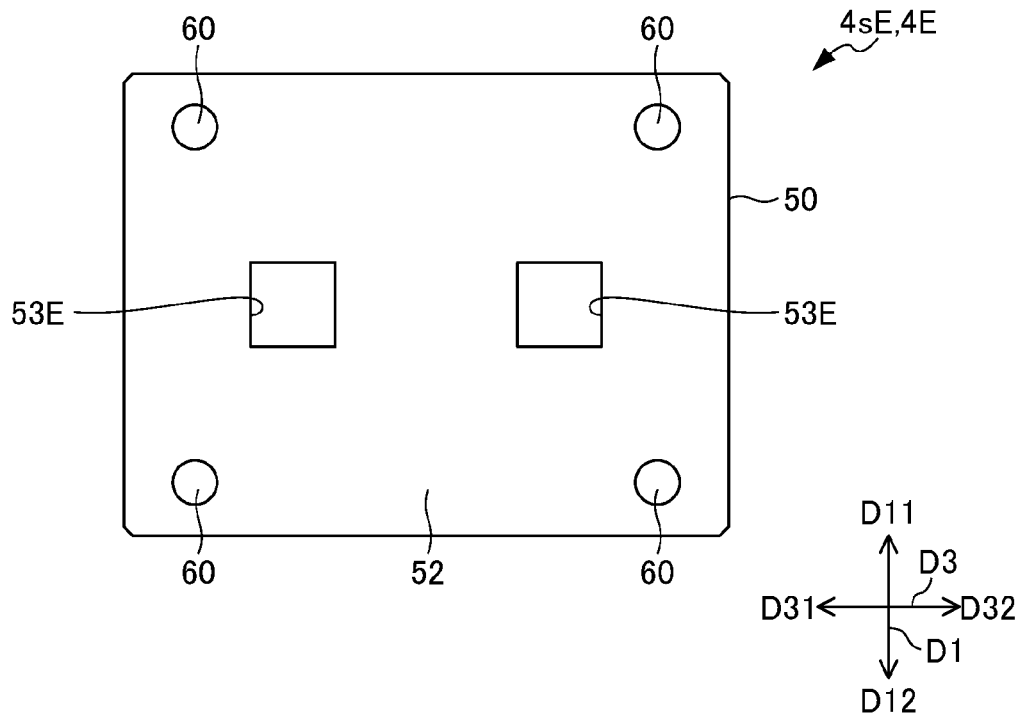
FIG. 15A is a bottom view illustrating a second cushioning portion 4sE of a lower cushioning material 4E in a packing structure 1 according to the sixth embodiment of the present invention.
Figure 15B:
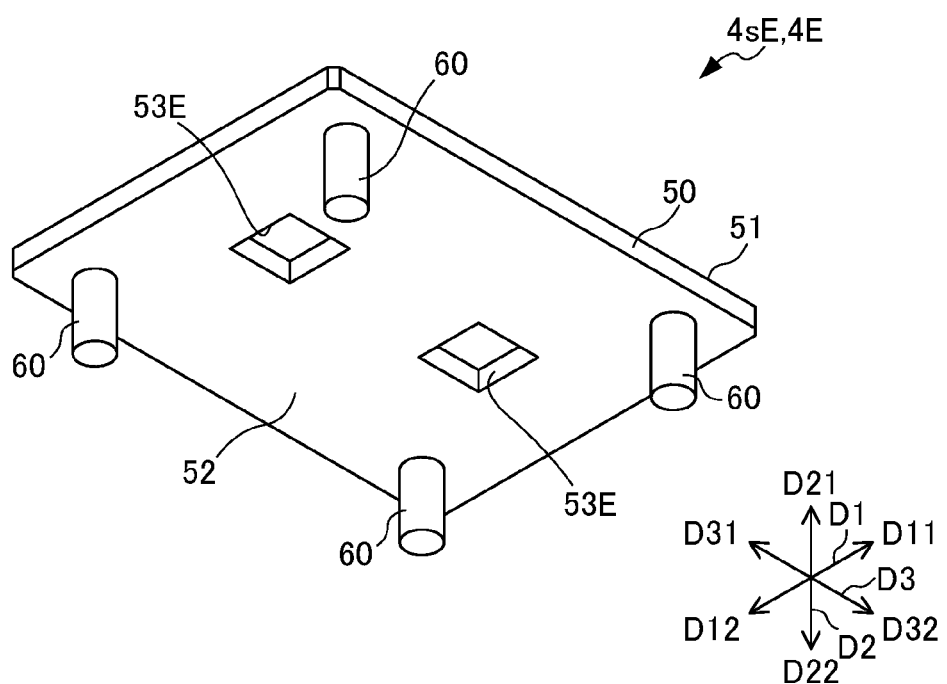
FIG. 15B is a perspective view of the second cushioning portion 4sE of FIG. 15A as seen from below diagonally.

FIG. 15A is a bottom view illustrating a second cushioning portion 4sE which is combined with a cushioning-portion connecting portion 70 having a basic truncated-conic shape in a lower cushioning material 4E of the sixth embodiment. FIG. 15B is a perspective view of the second cushioning portion 4sE of FIG. 15A as seen from below diagonally.

In the second cushioning portion 4sE of the sixth embodiment, the shape of the through-hole 53E in the cushioning plate-like portion 50 is formed in a square shape. More specifically, it is formed in a tubular square shape of which the lengths of the four sides and the angles formed are equal. Regarding the configurations other than this, since the second embodiment is the same as the first embodiment, the same members are illustrated with the same reference numerals, and the descriptions thereof will be omitted.

In the case of the second cushioning portion 4sE of the sixth embodiment as well, the diameter of a circle in internal contact with the through-hole 53E in the cushioning plate-like portion 50 is larger than the outside diameter of the truncated-conic shape of the cushioning-portion connecting portion 70 from the lower end portion to a portion just before the upper end portion and smaller than the outside diameter of the truncated-conic shape of the cushioning-portion connecting portion 70 from a portion just before the upper end portion to the upper end portion. For this reason, when the cushioning-portion connecting portion 70 is inserted into the through-hole 53E in the cushioning plate-like portion 50 from the lower end portion, a portion in the proximity of the upper end portion of the cushioning-portion connecting portion 70 is fitted by being pushed inwards in a radial direction to be collapsed by the through-hole 53E, whereby the first cushioning portion 4f and the second cushioning portion 4sE are integrally fixed.

Then, in the case of the second cushioning portion 4sE of the sixth embodiment as well, since it is integrally fixed with the first cushioning portion 4f by means of the fitting of the portion in the proximity of the cushioning-portion connecting portion 70 in the truncated-conic shape and the through-hole 53E in the cushioning plate-like portion 50, it functions similarly to the lower cushioning material 4 in the case of the first embodiment, and thus similar effects can be obtained.

Figure 16A:
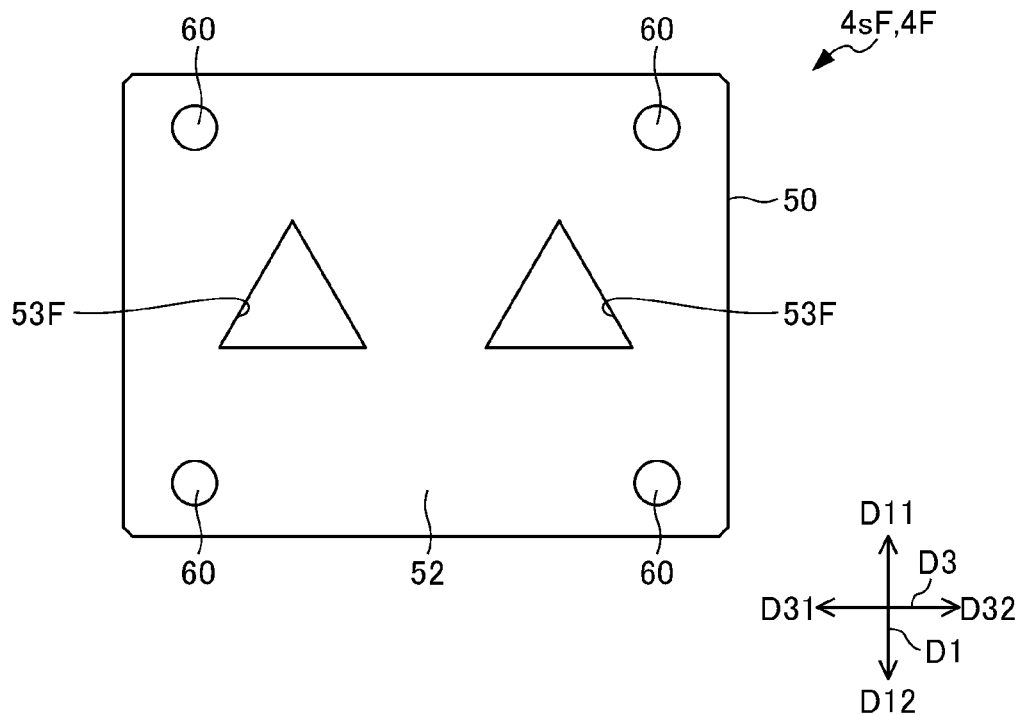
FIG. 16A is a bottom view illustrating a second cushioning portion 4sF of a lower cushioning material 4F in a packing structure 1 according to the seventh embodiment of the present invention.
Figure 16B:
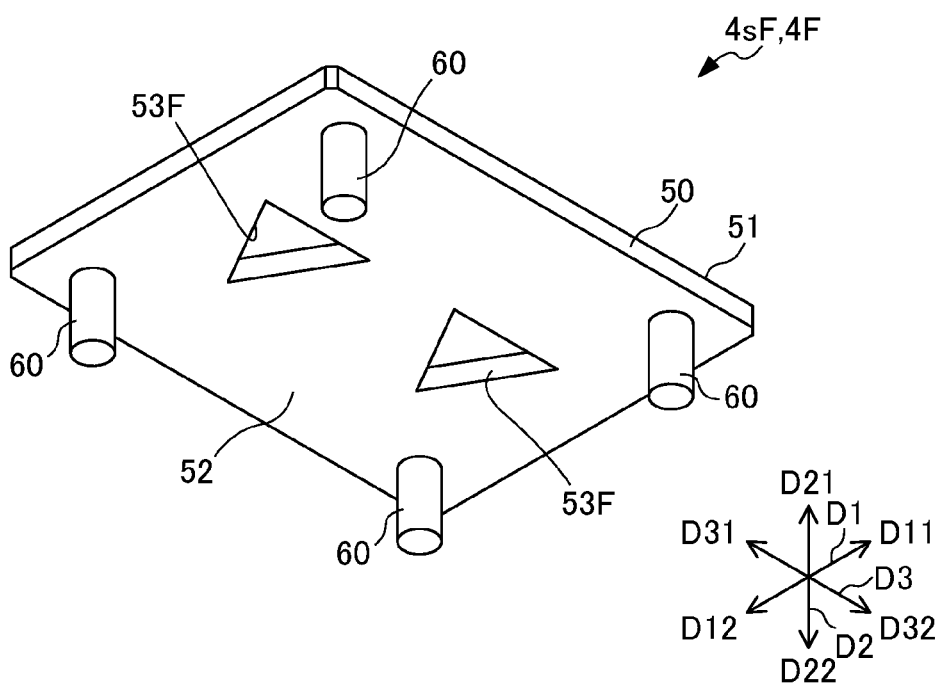
FIG. 16B is a perspective view of the second cushioning portion 4sF of FIG. 15A as seen from below diagonally.

FIG. 16A is a bottom view illustrating a second cushioning portion 4sF, which is combined with a cushioning-portion connecting portion 70 having a basic truncated-conic shape, in a lower cushioning material 4F of the seventh embodiment. FIG. 16B is a perspective view of the second cushioning portion 4sF of FIG. 16A as seen from below diagonally.

In the second cushioning portion 4sF of the seventh embodiment, the shape of the through-hole 53F in the cushioning plate-like portion 50 is formed in a triangle shape. More specifically, it is formed in a cylindrical triangle shape of which the lengths of the three sides and the angles formed are equal. Regarding the configurations other than this, due to being the same as the first embodiment, the same members are illustrated with the same reference numerals, and the descriptions thereof will be omitted.

In the case of the second cushioning portion 4sF of the seventh embodiment as well, the diameter of a circle in internal contact with the through-hole 53F in the cushioning plate-like portion 50 is a larger diameter than the outside diameter of the truncated-conic shape of the cushioning-portion connecting portion 70 from the lower end portion to a portion just before the upper end portion and a smaller diameter than the outside diameter of the truncated-conic shape of the cushioning-portion connecting portion 70 from a portion just before the upper end portion to the upper end portion. For this reason, when the cushioning-portion connecting portion 70 is inserted into the through-hole 53F in the cushioning plate-like portion 50 from the lower end portion, a portion in the proximity of the upper end portion of the cushioning-portion connecting portion 70 is fitted by being pushed inwards in a radial direction to be collapsed by the through-hole 53F, whereby the first cushioning portion 4f and the second cushioning portion 4sF are integrally fixed.

Then, in the case of the second cushioning portion 4sF of the seventh embodiment as well, since it is integrally fixed with the first cushioning portion 4f by means of the fitting of the portion in the proximity of the cushioning-portion connecting portion 70 in the truncated-conic shape and the through-hole 53F in the cushioning plate-like portion 50, it functions similarly to the lower cushioning material 4 in the case of the first embodiment, and thus similar effects can be obtained.

Figure 17A:
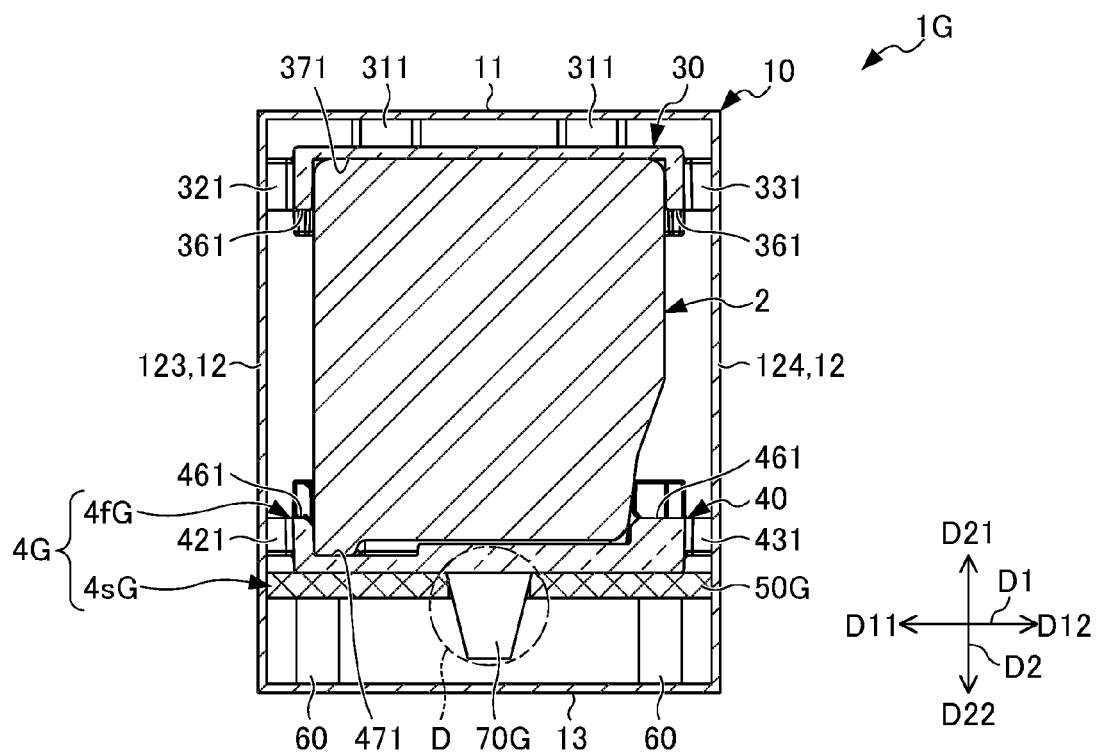
FIG. 17A is a longitudinal cross-sectional side view, similar to FIG. 7A, illustrating an aspect of fixing a first cushioning portion 4fG and a second cushioning portion 4sG of a lower cushioning material 4G in a packing structure 1 according to the eighth embodiment of the present invention.
Figure 17B:
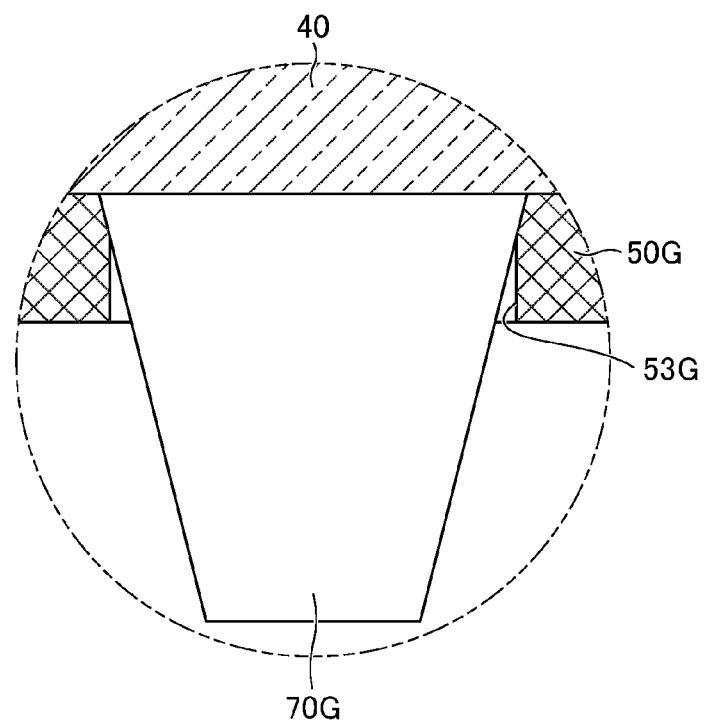
FIG. 17B is an enlarged view of a part D of FIG. 17A.

FIG. 17A is a longitudinal cross-sectional side view, similar to FIG. 7A, illustrating an aspect of fixing a first cushioning portion 4fG and a second cushioning portion 4sG in a lower cushioning material 4G according to the eighth embodiment. FIG. 17B is an enlarged view of a part D of FIG. 17A.

In the first cushioning portion 4fG of the eighth embodiment, the cushioning-portion connecting portion 70G is formed in a basic truncated-conic shape. In the second cushioning portion 4sG of the eighth embodiment, the cushioning plate-like portion 50G has a through-hole 53G of basic round hole shape. However, in the eighth embodiment, the material of the cushioning-portion connecting portion 70G is more rigid than the material of the cushioning plate-like portion 50G. For example, in a case in which the cushioning-portion connecting portion 70G is made of basic styrene foam, the cushioning plate-like portion 50G is made of a material softer than the styrene foam.

In the case of the first cushioning portion 4fG of the eighth embodiment as well, the outside diameter of the truncated-conic shape of the cushioning-portion connecting portion 70G from the lower end portion to a portion just before the upper end portion is smaller than the diameter of the through-hole 53G of round hole shape in the cushioning plate-like portion 50G of the second cushioning portion 4sG. The outside diameter of the truncated-conic shape of the cushioning-portion connecting portion 70G from a portion just before the upper end portion to the upper end portion is larger than the diameter of the through-hole 53G of round hole shape in the cushioning plate-like portion 50G. For this reason, when the cushioning-portion connecting portion 70G is inserted into the through-hole 53G in the cushioning plate-like portion 50G from the lower end portion, the through-hole 53G is fit in a manner being pressed outward to become wide in a radial direction by a portion in the proximity of the upper end portion of the cushioning-portion connecting portion 70G, whereby the first cushioning portion 4fG and the second cushioning portion 4sG are integrally fixed.

Then, in the case of the first cushioning portion 4fG of the eighth embodiment as well, since it is integrally fixed with the second cushioning portion 4sG by means of the fitting of the portion in the proximity of the cushioning-portion connecting portion 70G and the through-hole 53G of round hole shape in the cushioning plate-like portion 50G, it functions similarly to the lower cushioning material 4 in the case of the first embodiment, and thus similar effects can be obtained.

Figure 18A:
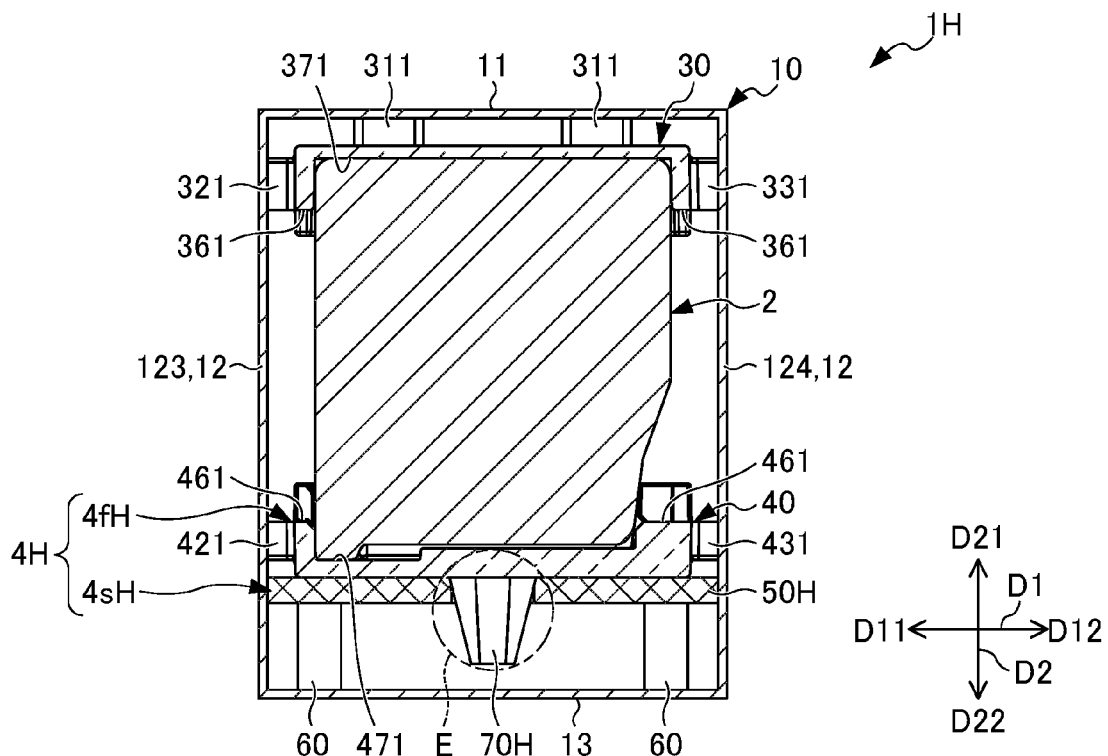
FIG. 18A is a longitudinal cross-sectional side view, similar to FIG. 7A, illustrating an aspect of fixing a first cushioning portion 4fH and a second cushioning portion 4sH of a lower cushioning material 4H in a packing structure 1 according to the ninth embodiment of the present invention.
Figure 18B:
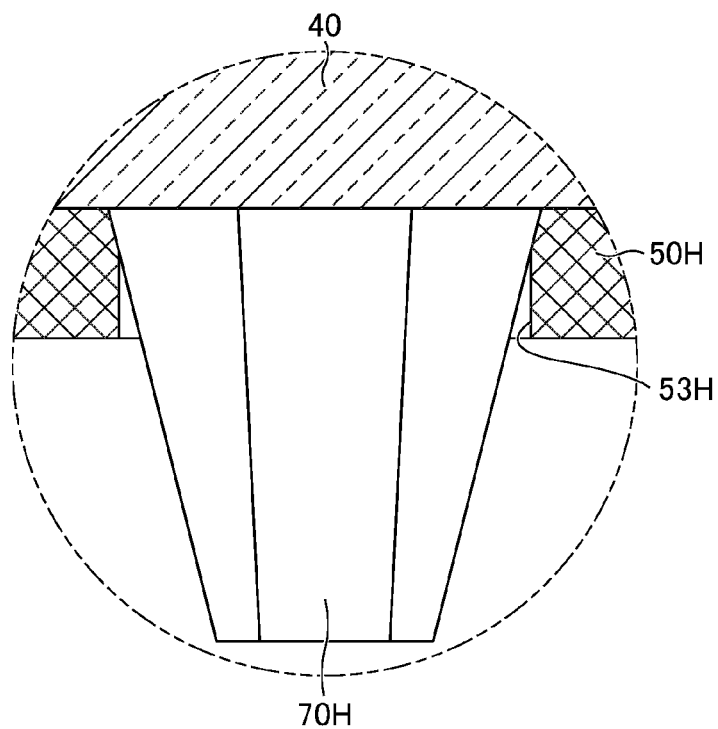
FIG. 18B is an enlarge view of a part E of FIG. 18A.

FIG. 18A is a longitudinal cross-sectional side view, similar to FIG. 7A, illustrating an aspect of fixing a first cushioning portion 4fH and a second cushioning portion 4sH in a lower cushioning material 4H according to the ninth embodiment. FIG. 18B is an enlarged view of a part E of FIG. 18A.

In the first cushioning portion 4fH of the ninth embodiment, the cushioning-portion connecting portion 70H has a cross shape as illustrated in FIGS. 10A and 10B, a triangle shape as illustrated in FIGS. 11A and 11B, or a star shape as illustrated in FIGS. 12A and 12B. In the second cushioning portion 4sH of the ninth embodiment, the cushioning plate-like portion 50H has a through-hole 53H in a basic round hole shape. However, in the ninth embodiment, the material of the cushioning-portion connecting portion 70H is more rigid than the material of the cushioning plate-like portion 50H. For example, in a case in which the cushioning-portion connecting portion 70H is made of basic styrene foam, the cushioning plate-like portion 50H is made of a material softer than the styrene foam.

In the case of the first cushioning portion 4fH of the ninth embodiment as well, the diameter of a circumscribed circle of the cross sectional shape of the cushioning-portion connecting portion 70H from the lower end portion to a portion just before the upper end portion is smaller than the diameter of the through-hole 53H of round hole shape in the cushioning plate-like portion 50H of the second cushioning portion 4sH. The diameter of the circumscribed circle of the cross-sectional shape of the cushioning-portion connecting portion 70H from a portion just before the upper end portion to the upper end portion is larger than the diameter of the through-hole 53H of round hole shape in the cushioning plate-like portion 50H. For this reason, when the cushioning-portion connecting portion 70H is inserted into the through-hole 53H in the cushioning plate-like portion 50H from the lower end portion, the through-hole 53H is fit in a manner being pressed outward to become wide in a radial direction by a portion in the proximity of the upper end portion of the cushioning-portion connecting portion 70H, whereby the first cushioning portion 4fH and the second cushioning portion 4sH are integrally fixed.

Then, in the case of the first cushioning portion 4fH of the ninth embodiment as well, since it is integrally fixed with the second cushioning portion 4sH by means of the fitting of the portion in the proximity of the cushioning-portion connecting portion 70H and the through-hole 53H of round hole shape in the cushioning plate-like portion 50H, it functions similarly to the lower cushioning material 4 in the case of the first embodiment, and thus similar effects can be obtained.

Figure 19:
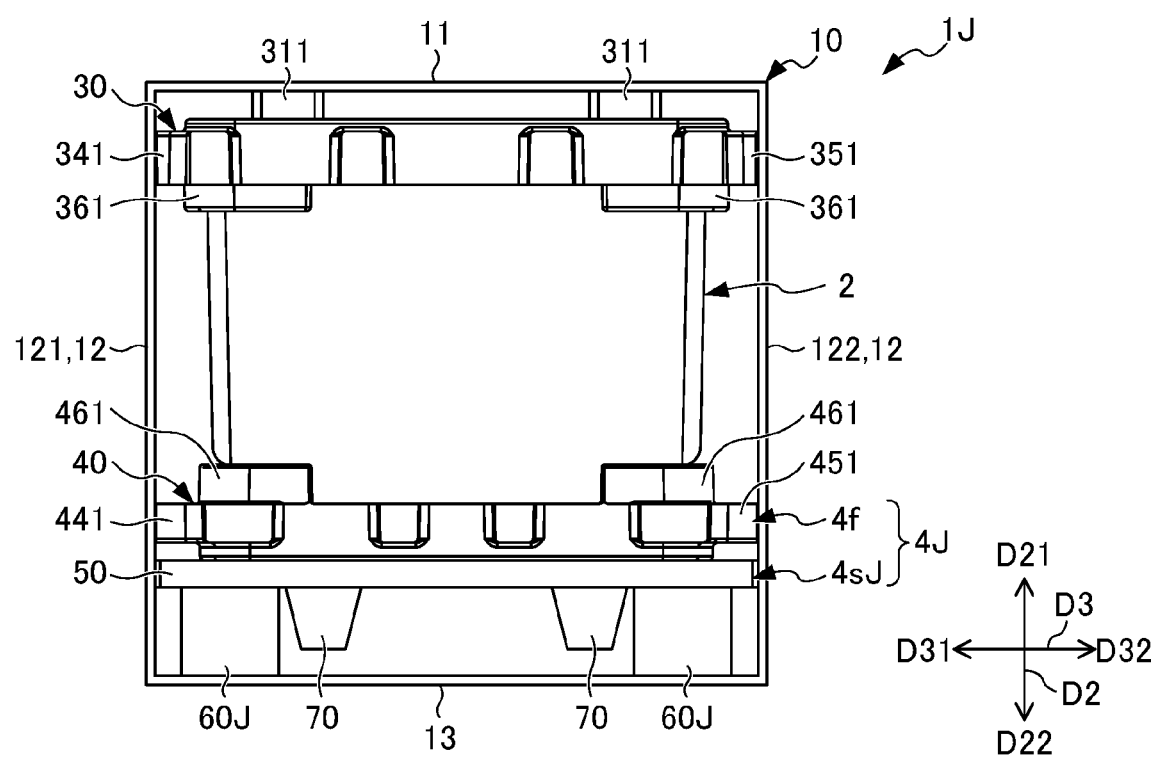
FIG. 19 is a front view, similar to FIG. 3B, illustrating a lower cushioning material 4I in a packing structure 1I according to the tenth embodiment.

FIG. 19 is a front view, similarly to FIG. 3B, illustrating a second cushioning portion 4sJ of a lower cushioning material 4J in a packing structure 1J of the tenth embodiment.

In the second cushioning portion 4sJ of the tenth embodiment, cushioning leg portions 60J are configured from sponge in place of the coil springs 60 in the case of the first embodiment. The sponge 60J is made of a material which is softer than the styrene foam of the cushioning-portion connecting portion 70, and has a height approximately equivalent to that of the coil spring 60. Although the sponges 60J may be arranged at the four corners of the cushioning plate-like portion 50J similarly to the coil springs 60, the sponge 60J may also be arranged at the four corners so as to surround the cushioning-portion connecting portion 70. It should be noted that the sponges 60J are illustrated schematically in the drawings.

In the case of the lower cushioning material 4J of the tenth embodiment as well, similarly to the lower cushioning material 4 in the case of the first embodiment, when vibration is applied to the packing box 10 from outside the packing box 10, the vibration substantially propagates via the sponges 60J to the substrate storing container 2 protected by the upper cushioning material 30 and the cushioning support portion 40 of the lower cushioning material 4 made of styrene foam. The sponges 60J absorb and attenuate the vibration. For this reason, the vibration applied to the packing box 10 does not propagate directly to the substrate storing container 2, but rather propagates to the substrate storing container 2 after being damped properly by the sponges 60J. Therefore, the vibration received by the substrate storing container 2 becomes weaker than the vibration applied to the packing box 10, and thus a risk of damaging the substrates W consisting of semiconductor wafers stored in the substrate storing container 2 is avoided.

In a case of the packing box 10 falling from a certain height by any chance, if the sponges 60J cannot absorb the impact from falling and shrink, the lower end portion of the cushioning-portion connecting portion 70 made of styrene foam will abut the bottom plate 13 of the packing structure 10 and the impact from falling will be absorbed by the cushioning-portion connecting portion 70. At this moment, the cushioning support portion 40 similarly absorbs the impact from falling. Therefore, the impact from falling propagates to the substrate storing container 2 via the cushioning-portion connecting portion 70 and the cushioning support portion 40 made of styrene foam without directly passing through the rigid cushioning plate-like portion 50. Therefore, the magnitude of the impact received by the substrate storing container 2 is the magnitude of an impact that can be anticipated as not causing significant damage to the substrates W consisting of semiconductor wafers stored in the substrate storing container 2, a result of which the substrates W may avoid significant damage.

Then, in the case of the lower cushioning material 4J of the tenth embodiment as well, it functions similarly to the lower cushioning material 4 in the case of the first embodiment, and thus similar effects can be obtained.

It should be noted that, in a case of arranging the sponges 60J at the four corners so as to surround the cushioning-portion connecting portion 70 in the tenth embodiment, for example, the cushioning plate-like portion 50J of the second cushioning portion 4sJ may also be integrally formed by the same type of sponge as the sponge 60J of the cushioning leg portion. With such a configuration, it is possible to obtain the second cushioning portion 4sJ inexpensively.

The present invention is not limited to the abovementioned embodiments, and modifications thereto within the technical scope claimed in the claims are possible. For example, although the cushioning leg portion is configured with the coil spring 60 or the sponge 60J, the present invention is not limited thereto. For example, it may be configured by any of an air spring, gel, rubber, and polymeric foam having elasticity. Herein, polymeric foam body having elasticity indicates that polymeric foams without elasticity such as pumice are not included.

In a case in which the cushioning leg portion 60 is configured by any of an air spring, gel, rubber, and polymeric foam having elasticity, it is possible to select a material that constitutes the cushioning leg portion appropriately according to the elasticity required.

Furthermore, in a case of constituting the cushioning plate-like portion 50 with a rigid body, the rigid body may be configured by a plywood board or an aluminum plate (sheet metal).

Furthermore, although the packing box 10 is composed of a so-called plastic card board box (corrugated plastic, also known as "pladan"), the present invention is not limited thereto. For example, it may be configured so that the packing box is composed of corrugated cardboard made of paper or aluminum frame.

Furthermore, the substrate storing container is not limited to the shapes and the dimensions of the embodiments.

EXPLANATION OF REFERENCE NUMERALS 1 packing structure
10 packing box
2 substrate storing container
4 lower cushioning material
4f first cushioning portion
4s second cushioning portion
40 second cushioning portion
40 cushioning support portion
51 upper face
52 lower face
53 through-hole
60 coil spring (cushioning leg portion)
60J sponge (cushioning leg portion)
70 cushioning-portion connecting portion

The invention claimed is:

1. A packing structure for packing a substrate storing container for storing and transporting substrates composed of semiconductor wafers, comprising:
a packing box; and
a lower cushioning material on which the substrate storing container is placed in the packing box,
wherein the lower cushioning material includes a first cushioning portion and a second cushioning portion,
wherein the first cushioning portion includes: a cushioning support portion that is configured by a cushioning material, and directly abuts the substrate storing container to support the substrate storing container; and a cushioning-portion connecting portion that is configured by a cushioning material, is connected to the cushioning support portion, and extends downwards from the cushioning support portion,
wherein the second cushioning portion includes: a cushioning plate-like portion in which a through-hole is formed; and cushioning leg portions which are configured by a cushioning material which is softer than the cushioning-portion connecting portion of the first cushioning portion, and extend downwards from the cushioning plate-like portion, and
wherein the cushioning plate-like portion supports the first cushioning portion in a state in which the cushioning-portion connecting portion penetrates through the through-hole of the cushioning plate-like portion.

2. The packing structure according to claim 1,
wherein a lower end portion of the cushioning leg portion of the second cushioning portion is supported by the packing box, and
wherein a lower end portion of the cushioning-portion connecting portion of the first cushioning portion is not supported by the packing box, and is located more upwards than the lower end portion of the cushioning leg portion and spaced apart from the packing box.

3. The packing structure according to claim 1,
wherein the cushioning support portion and the cushioning-portion connecting portion of the first cushioning portion are integrally formed from identical cushioning material.

4. The packing structure according to claim 1,
wherein a cushioning material that constitutes the cushioning leg portion of the second cushioning portion is configured by any of a coil spring, an air spring, gel, sponge, rubber, and polymeric foam having elasticity.

5. The packing structure according to claim 1,
wherein the cushioning plate-like portion of the second cushioning portion is configured by a rigid body that has a plate-like shape including a flat upper face and a flat lower face and can abut the cushioning support portion of the first cushioning portion, and has rigidity which can suppress deformation of the cushioning support portion and support the cushioning support portion when the substrate storing container is placed on the cushioning support portion of the first cushioning portion.

6. The packing structure according to claim 1,
wherein a cushioning material that constitutes the cushioning leg portion of the second cushioning portion is configured with a sponge, the cushioning plate-like portion of the second cushioning portion is configured by a sponge which is the same as the sponge constituting the cushioning leg portion, and the cushioning plate-like portion and the cushioning leg portion are integrally formed.

7. The packing structure according to claim 1,
wherein the cushioning-portion connecting portion of the first cushioning portion is not adhered to the cushioning plate-like portion of the second cushioning portion, and is fixed to the cushioning plate-like portion by fitting into the through-hole of the cushioning plate-like portion.

* * * * *